(12) United States Patent
Lee et al.

(10) Patent No.: US 12,094,940 B2
(45) Date of Patent: Sep. 17, 2024

(54) SEMICONDUCTOR DEVICE

(71) Applicant: Samsung Electronics Co., Ltd., Suwon-si (KR)

(72) Inventors: Doohyun Lee, Hwaseong-si (KR);
Heonjong Shin, Yongin-si (KR);
Seon-Bae Kim, Hwaseong-si (KR);
Minchan Gwak, Hwaseong-si (KR);
Jinyoung Park, Hwaseong-si (KR);
Hyunho Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 462 days.

(21) Appl. No.: 17/546,213

(22) Filed: Dec. 9, 2021

(65) Prior Publication Data

US 2022/0384591 A1 Dec. 1, 2022

(30) Foreign Application Priority Data

Jun. 1, 2021 (KR) .......................... 10-2021-0070658

(51) Int. Cl.
*H01L 29/423* (2006.01)
*H01L 21/8238* (2006.01)
(Continued)

(52) U.S. Cl.
CPC ...... *H01L 29/41775* (2013.01); *H01L 27/092* (2013.01); *H01L 29/41733* (2013.01);
(Continued)

(58) Field of Classification Search
CPC ............ H01L 29/41775; H01L 27/092; H01L 29/41733; H01L 29/42392;
(Continued)

(56) References Cited

U.S. PATENT DOCUMENTS 9,490,317 B1 11/2016 Labonte et al.
9,691,897 B2 6/2017 Xie et al.
(Continued)

FOREIGN PATENT DOCUMENTS

KR 10-1785163 B1 10/2017
KR 10-2195406 B1 12/2020

*Primary Examiner* — David Vu
(74) *Attorney, Agent, or Firm* — Wolf, Greenfield & Sacks, P.C.

(57) ABSTRACT

A semiconductor device may include an active pattern on a substrate, a source/drain pattern on the active pattern, a channel pattern connected to the source/drain pattern, a gate electrode on the channel pattern, an active contact on the source/drain pattern, a first lower interconnection line on the gate electrode, and a second lower interconnection line on the active contact and at the same level as the first lower interconnection line. The gate electrode may include an electrode body portion and an electrode protruding portion, wherein the electrode protruding portion protrudes from a top surface of the electrode body portion and is in contact with the first lower interconnection line thereon. The active contact may include a contact body portion and a contact protruding portion, wherein the contact protruding portion protrudes from a top surface of the contact body portion and is in contact with the second lower interconnection line thereon.

20 Claims, 26 Drawing Sheets

(51) Int. Cl.
*H01L 27/092* (2006.01)
*H01L 29/417* (2006.01)
*H01L 29/786* (2006.01)
H01L 29/06 (2006.01)

(52) U.S. Cl.
CPC .. *H01L 29/42392* (2013.01); *H01L 29/78618* (2013.01); *H01L 29/0665* (2013.01)

(58) Field of Classification Search
CPC ........... H01L 29/78618; H01L 29/0665; H01L 21/76897; H01L 23/485; H01L 21/76883; H01L 21/823814; H01L 21/823864; H01L 21/823871; H01L 23/5283; H01L 21/823475; H01L 27/088; H01L 29/0673; H01L 29/0847; H01L 29/1079; H01L 29/41725; H01L 29/66439; H01L 29/775; H01L 29/42376; H01L 21/823828; H01L 21/28114; H01L 21/823807; H01L 21/823857; H01L 29/78696
See application file for complete search history.

(56) References Cited

U.S. PATENT DOCUMENTS

| | | | |
|---|---|---|---|
| 10,090,413 B2 * | 10/2018 | Kim | ................... H01L 29/161 |
| 10,128,187 B2 | 11/2018 | Zang et al. | |
| 10,497,612 B2 | 12/2019 | Xie et al. | |
| 2016/0365309 A1 | 12/2016 | Zhang | |
| 2019/0304902 A1 | 10/2019 | Subramanian et al. | |
| 2020/0176575 A1 | 6/2020 | Lee et al. | |
| 2021/0075406 A1 | 3/2021 | Kim et al. | |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2021-0070658, filed on Jun. 1, 2021, in the Korean Intellectual Property Office, the entire contents of which are hereby incorporated by reference.

BACKGROUND

The present inventive concepts relate to semiconductor devices, and in particular, to semiconductor devices including a field effect transistor.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOSFETs may lead to deterioration in operational properties of the semiconductor device. A variety of studies are being conducted to overcome technical limitations associated with the scale-down of the semiconductor device and to realize high performance semiconductor devices.

SUMMARY

Some example embodiments of the inventive concepts provide a semiconductor device with improved electric characteristics.

According to some example embodiments of the inventive concepts, a semiconductor device may include an active pattern on a substrate, a source/drain pattern on the active pattern, a channel pattern connected to the source/drain pattern, a gate electrode on the channel pattern, an active contact on the source/drain pattern, a first lower interconnection line on the gate electrode, and a second lower interconnection line, which is on the active contact and is at a same level as the first lower interconnection line. The gate electrode may include an electrode body portion and an electrode protruding portion, wherein the electrode protruding portion protrudes from a top surface of the electrode body portion and is in contact with a bottom surface of the first lower interconnection line. The active contact may include a contact body portion and a contact protruding portion, wherein the contact protruding portion protrudes from a top surface of the contact body portion and is in contact with a bottom surface of the second lower interconnection line.

According to some example embodiments of the inventive concepts, a semiconductor device may include an active pattern on a substrate, a source/drain pattern on the active pattern, a channel pattern connected to the source/drain pattern, a gate electrode on the channel pattern, an active contact on the source/drain pattern, a first lower interconnection line on the gate electrode, and a second lower interconnection line, which is on the active contact and is at a same level as the first lower interconnection line. The gate electrode may include an electrode body portion and an electrode protruding portion, wherein the electrode protruding portion protrudes from a top surface of the electrode body portion and is in contact with a bottom surface of the first lower interconnection line. The electrode protruding portion may include a stepwise structure, at which a slope of a side surface of the electrode protruding portion is discontinuously changed.

According to some example embodiments of the inventive concepts, a semiconductor device may include a substrate including a PMOSFET region and an NMOSFET region, which are adjacent to each other in a first direction, a first active pattern and a second active pattern provided on the PMOSFET and NMOSFET regions, respectively, a first source/drain pattern and a second source/drain pattern provided on the first active pattern and the second active pattern, respectively, active contacts on the first and second source/drain patterns, respectively; a first channel pattern and a second channel pattern, which are respectively connected to the first source/drain pattern and the second source/drain pattern, each channel pattern of the first and second channel patterns including a first semiconductor pattern, a second semiconductor pattern, and a third semiconductor pattern which are sequentially stacked and isolated from direct contact with each other, a first gate electrode and a second gate electrode, which are each extended in the first direction to cross the first and second active patterns, each gate electrode of the first and second gate electrodes including a first portion interposed between the substrate and the first semiconductor pattern, a second portion interposed between the first semiconductor pattern and the second semiconductor pattern, a third portion interposed between the second semiconductor pattern and the third semiconductor pattern, and a fourth portion on the third semiconductor pattern, a first gate insulating layer and a second gate insulating layer, the first gate insulating layer interposed between the first channel pattern and the first gate electrode, the second gate insulating layer interposed between the second channel pattern and the second gate electrode, a first gate spacer and a second gate spacer on side surfaces of the first and second gate electrodes, respectively, a first metal layer on the first and second gate electrodes, the first metal layer including first lower interconnection lines, and a second metal layer provided on the first metal layer, the second metal layer including second interconnection lines electrically connected to the first interconnection lines, respectively. Each of the active contacts may include a contact body portion and a contact protruding portion that protrudes from a top surface of the contact body portion and is in contact with a bottom surface of a corresponding one of the first interconnection lines. Each of the first and second gate electrodes may include an electrode body portion and an electrode protruding portion that protrudes from a top surface of the electrode body portion and is in contact with a bottom surface of a separate first interconnection line of the first interconnection lines.

DETAILED DESCRIPTION

Figure 1:
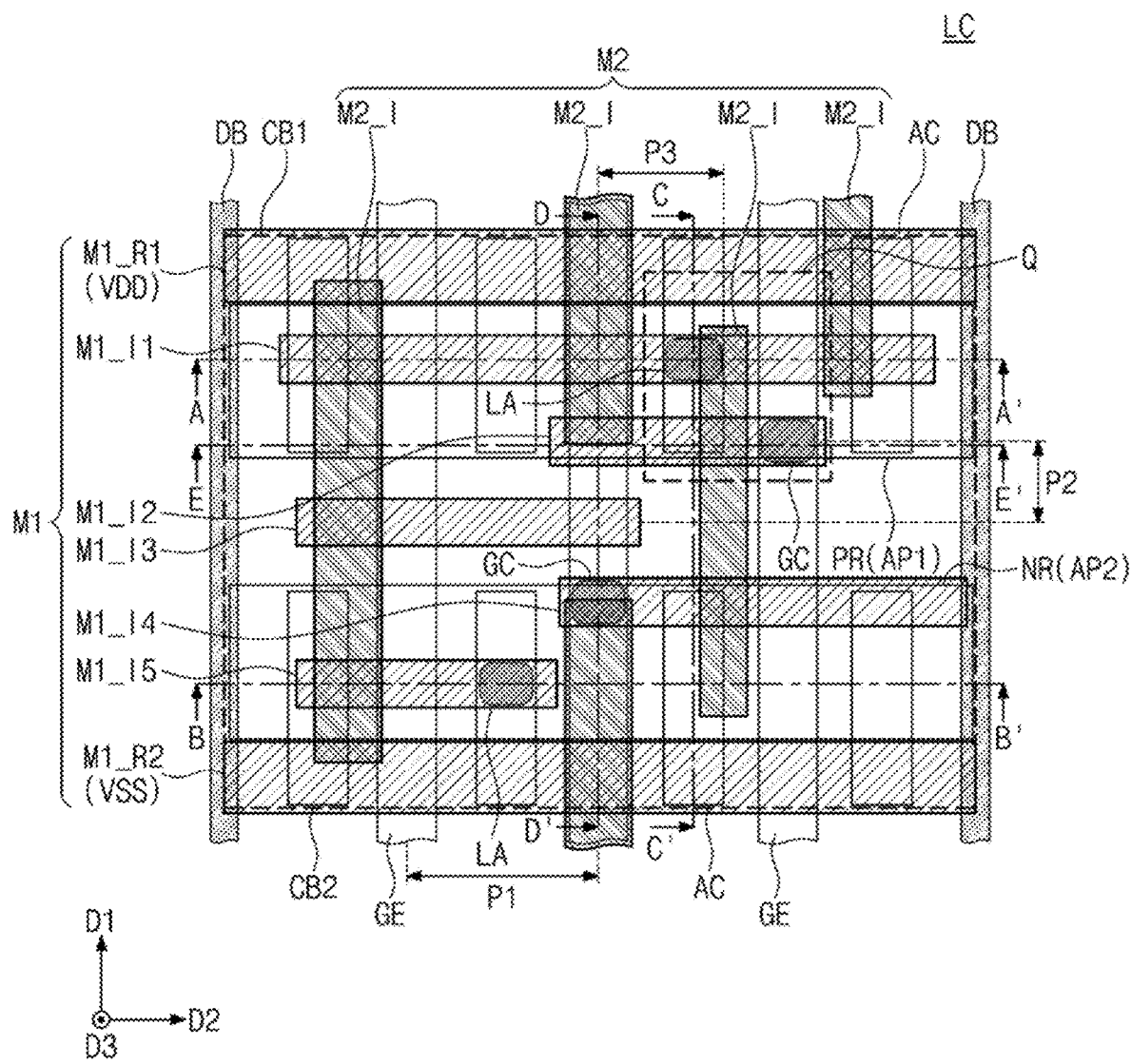
FIG. 1 is a plan view illustrating a semiconductor device according to some example embodiments of the inventive concepts.

Example embodiments of the inventive concepts will now be described more fully with reference to the accompanying drawings, in which some example embodiments are shown.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2A:
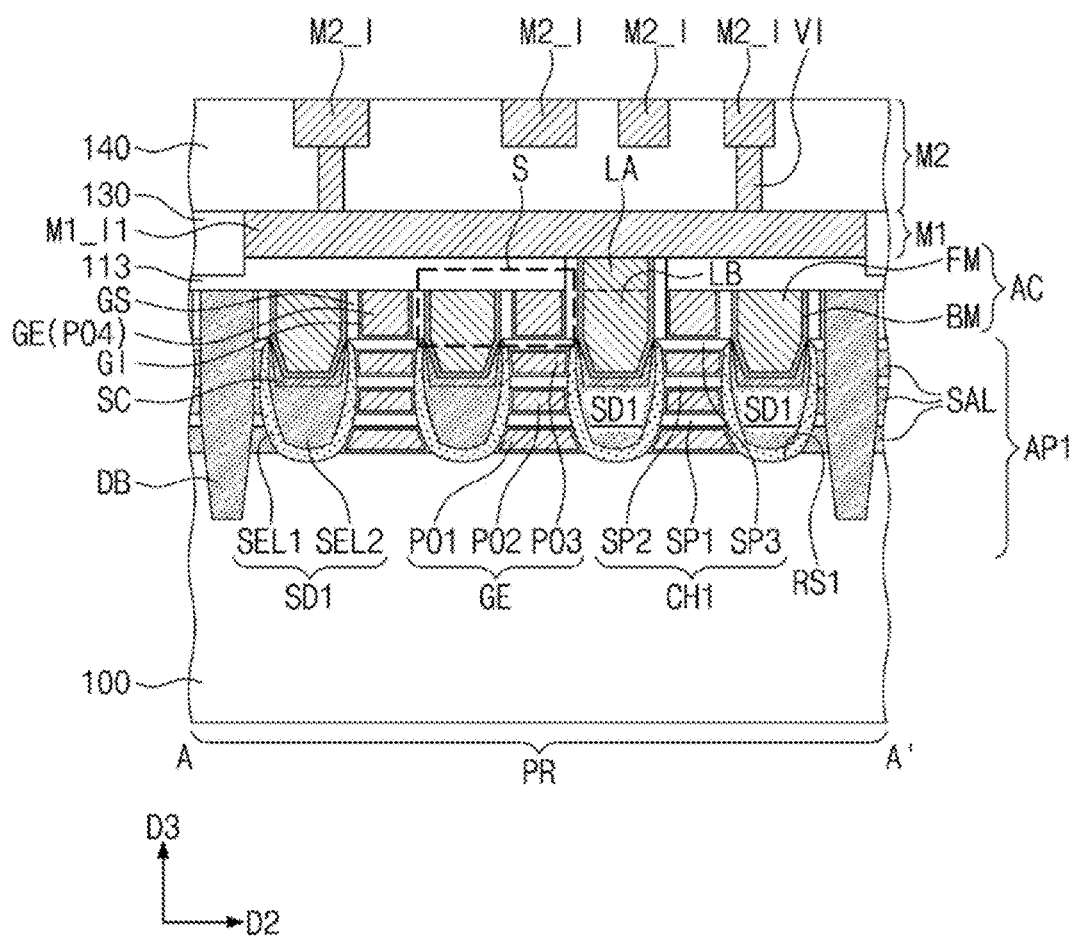
FIGS. 2A, 2B, 2C, 2D, and 2E are sectional views taken along lines A-A', B-B', C-C', D-D', and E-E", respectively, of FIG. 1.
Figure 2B:
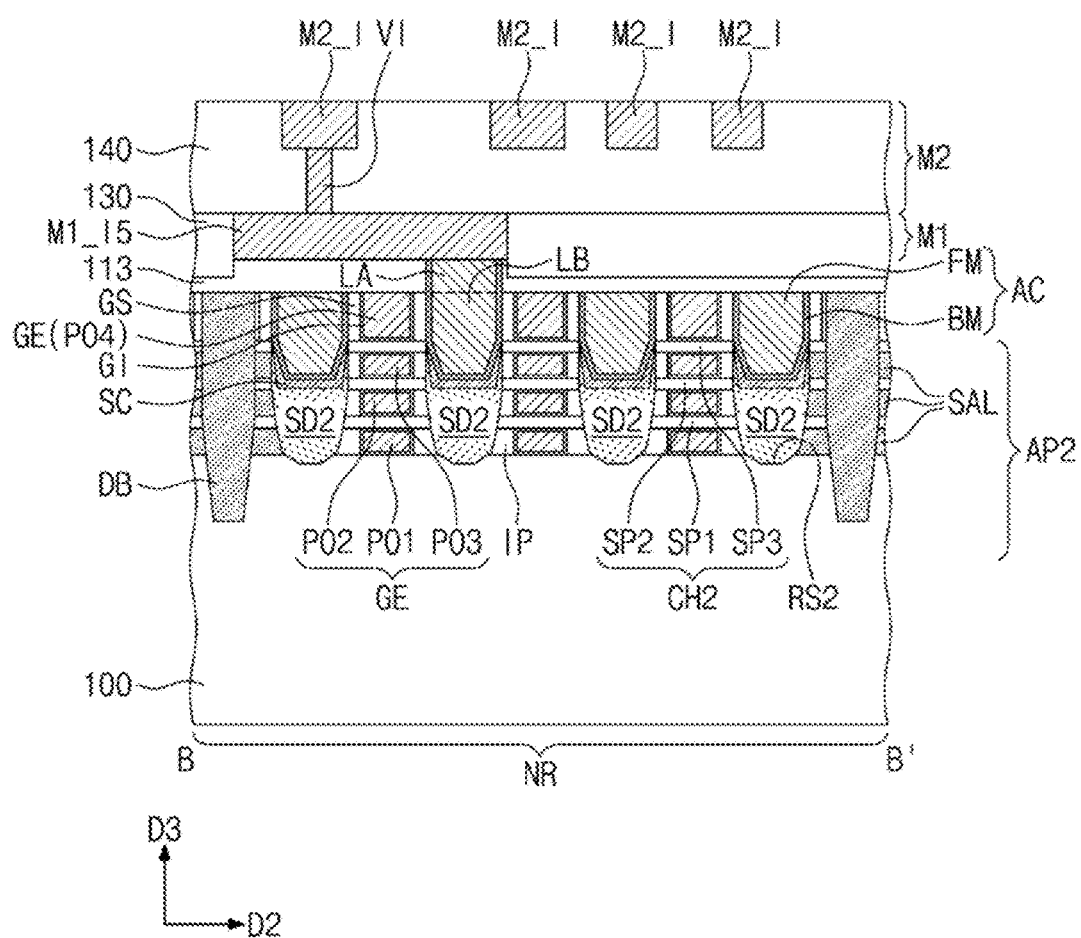
Figure 2C:
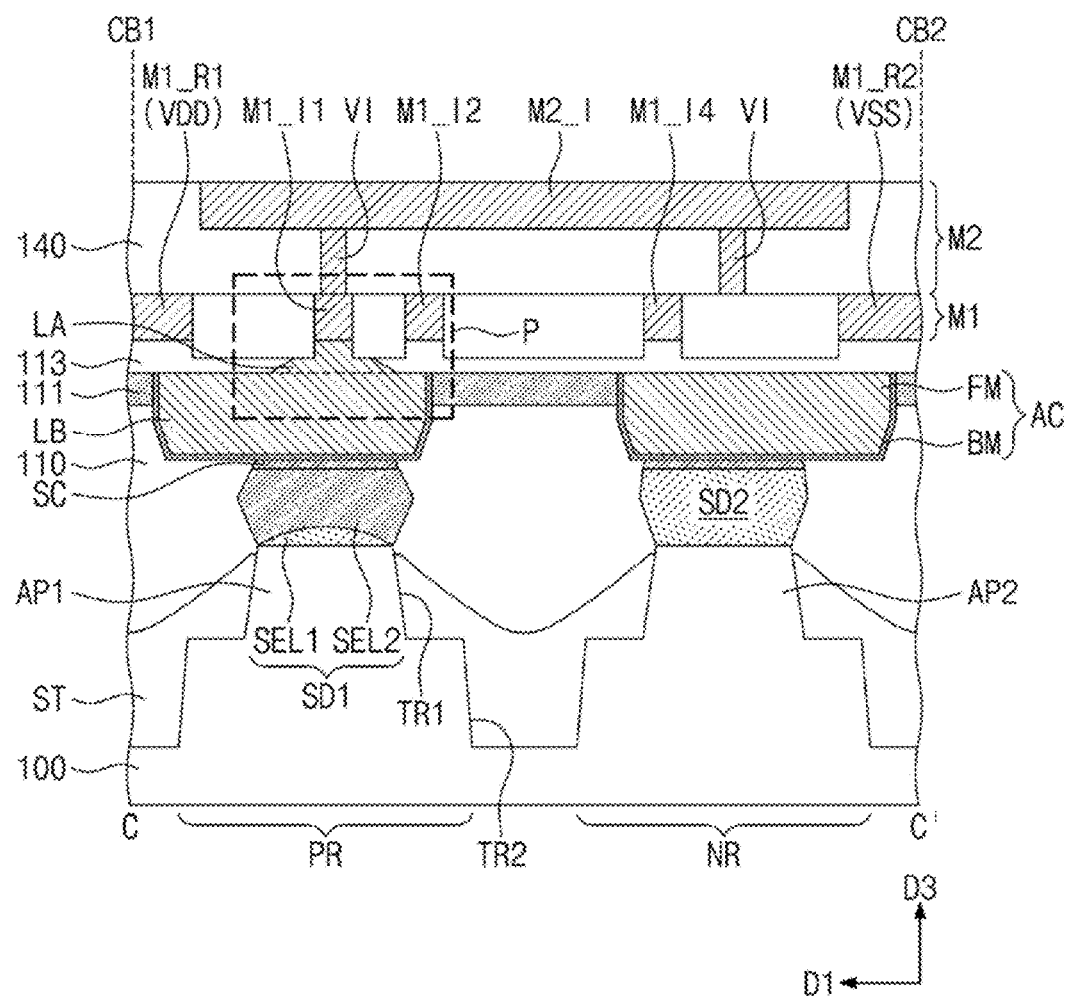
Figure 2D:
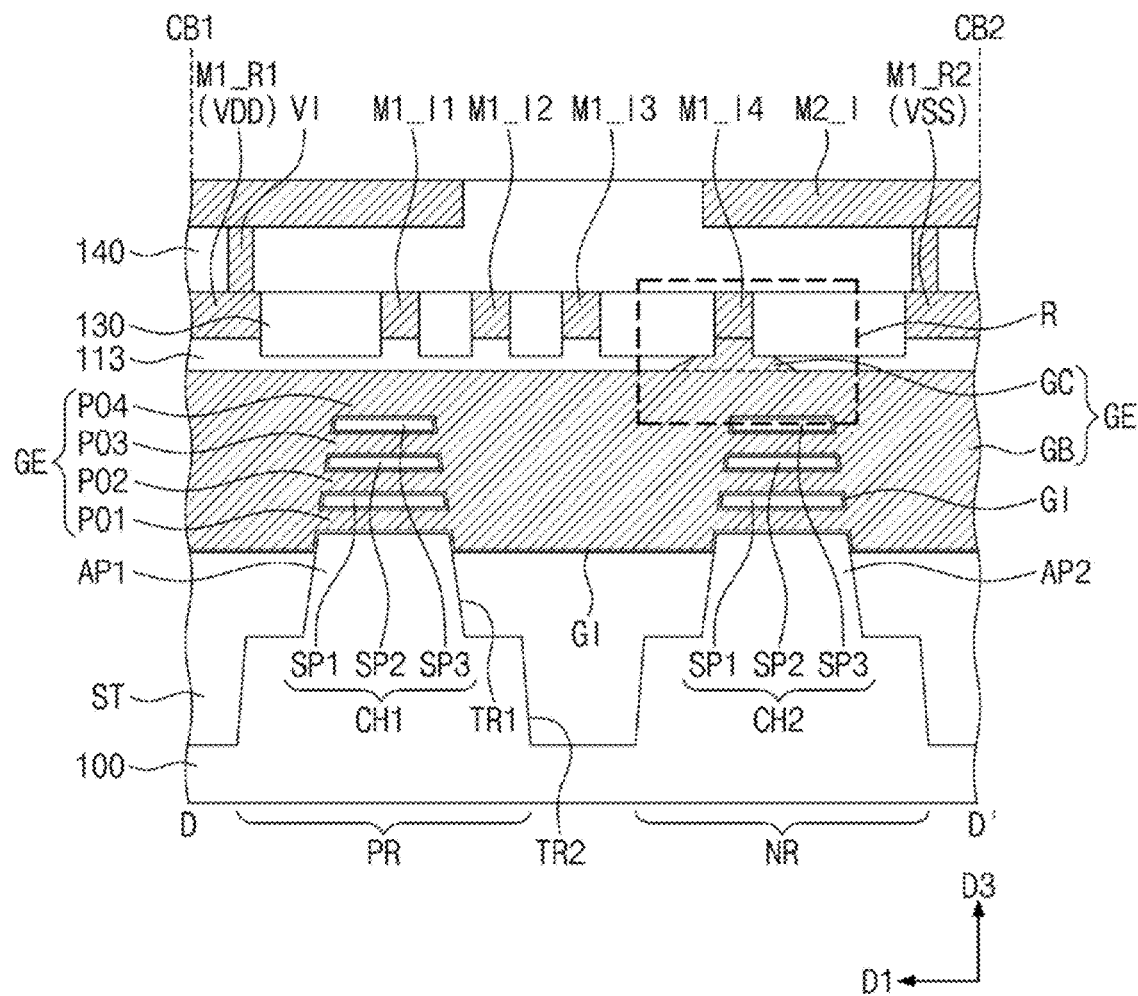
Figure 2E:
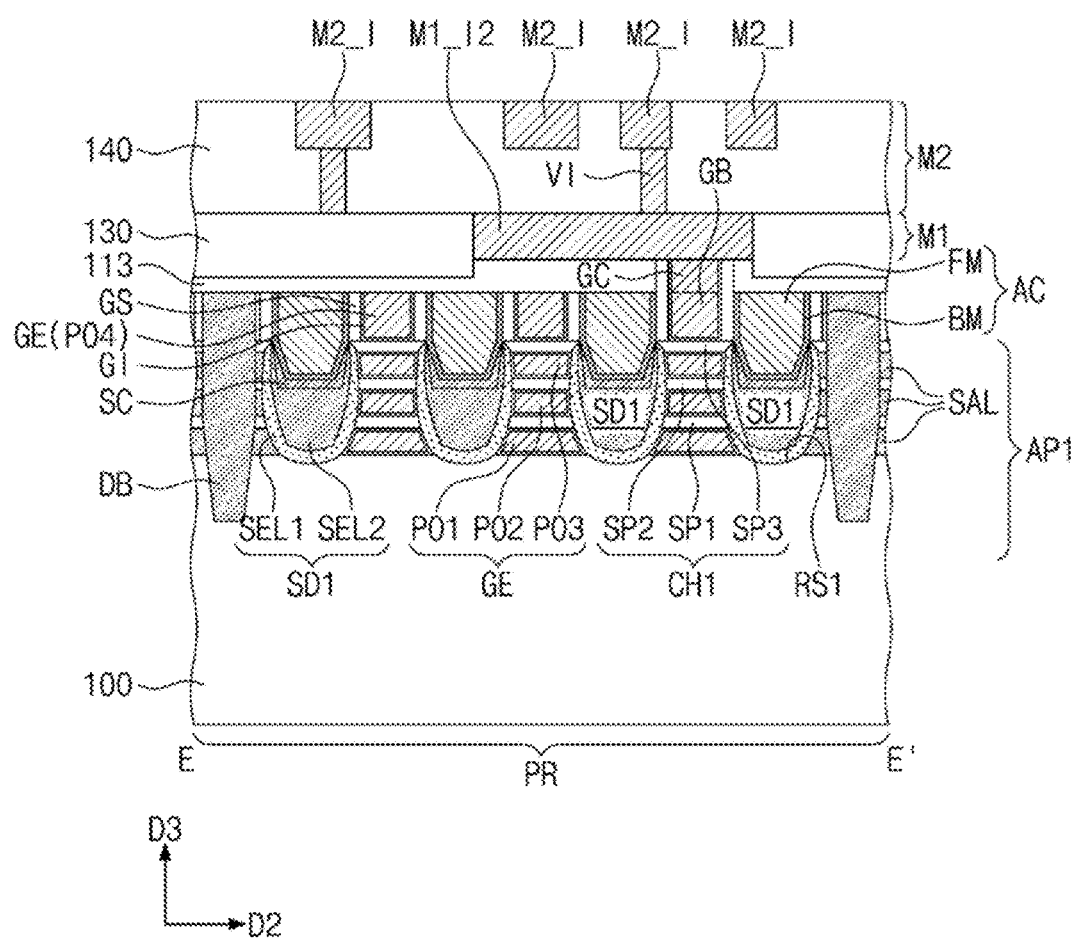
Figure 3A:
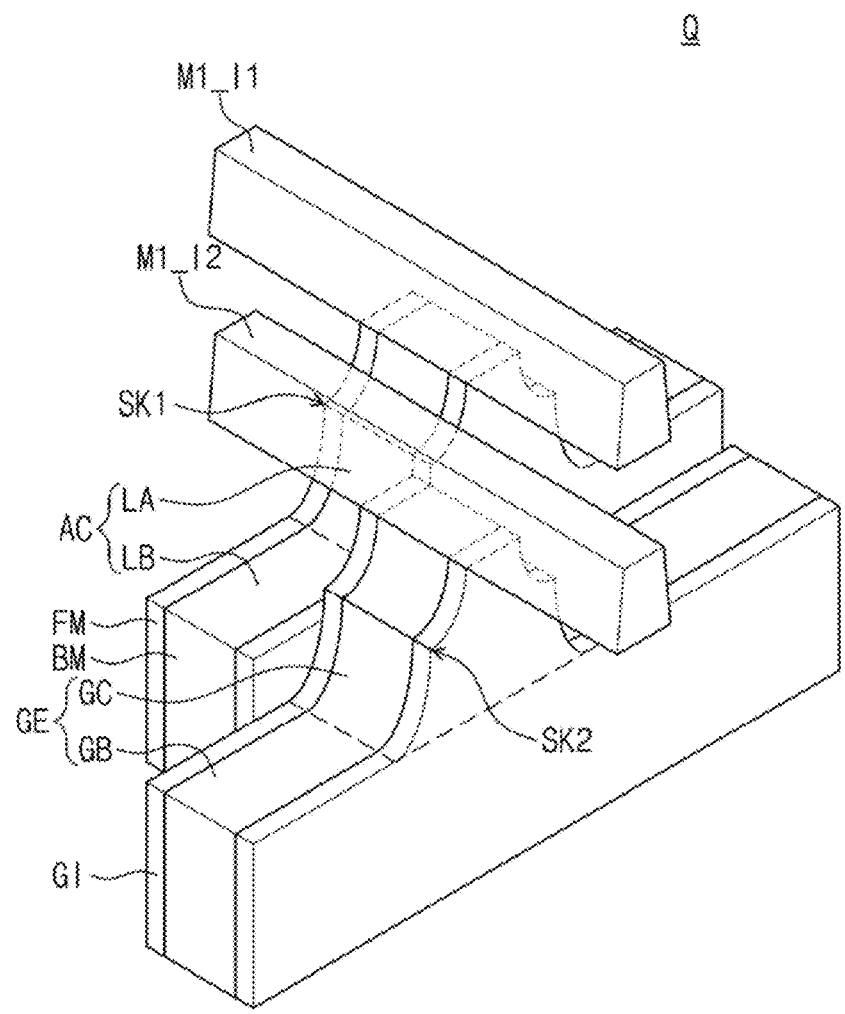
FIG. 3A is a perspective view illustrating a region Q of FIG. 1.
Figure 3B:
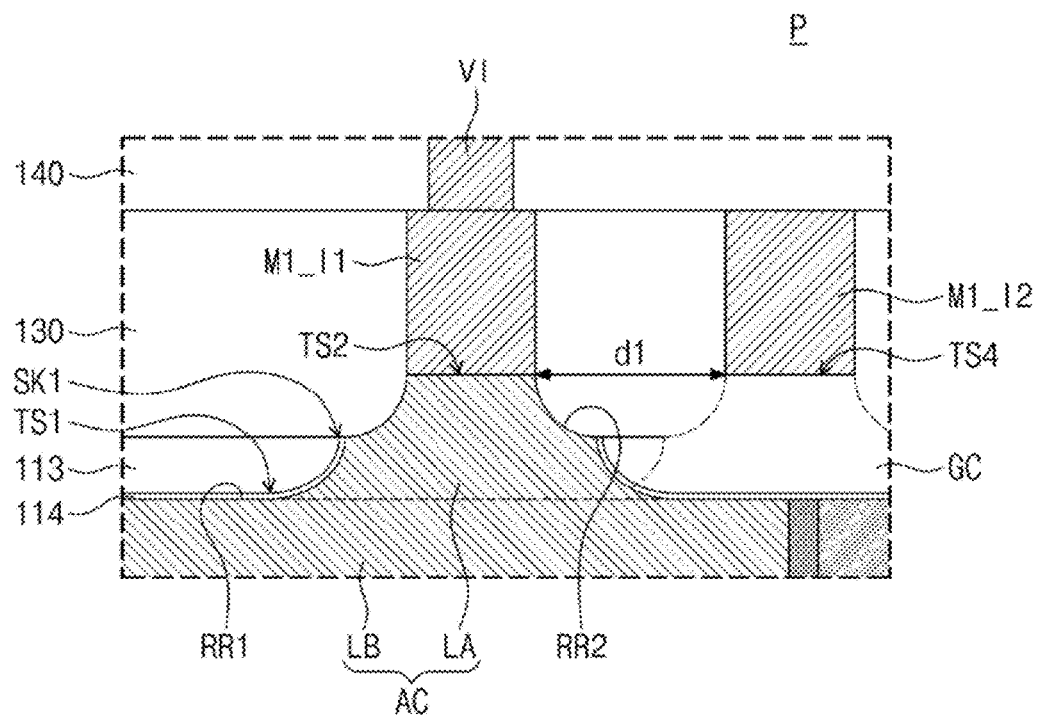
FIG. 3B is an enlarged view illustrating a region P of FIG. 2C.
Figure 3C:
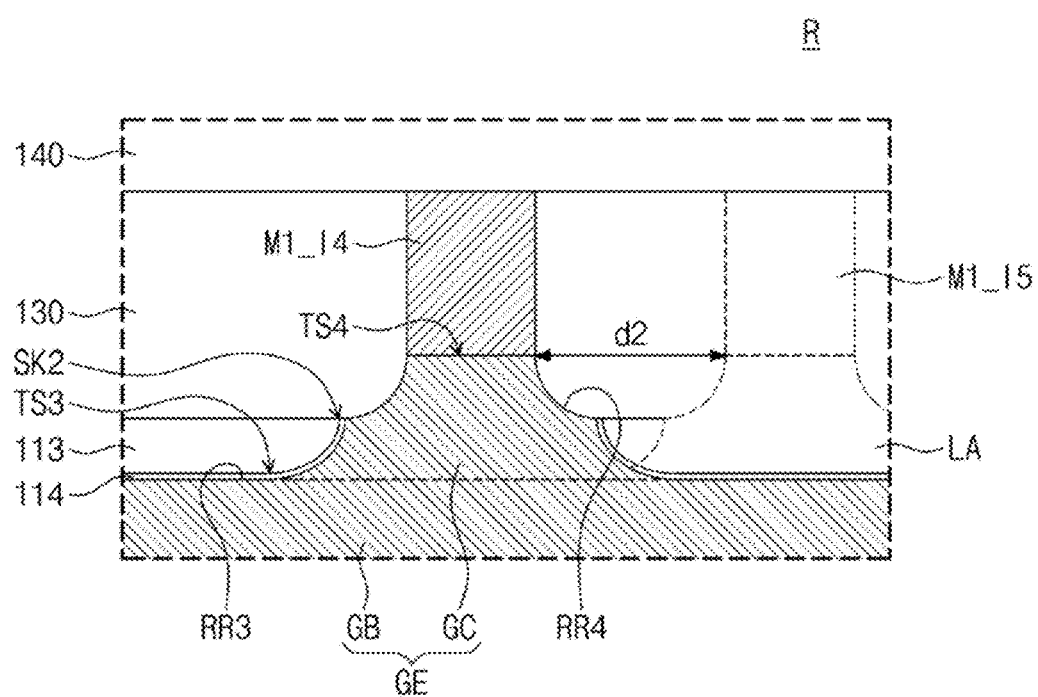
FIG. 3C is an enlarged view illustrating a region R of FIG. 2D.
Figure 3D:
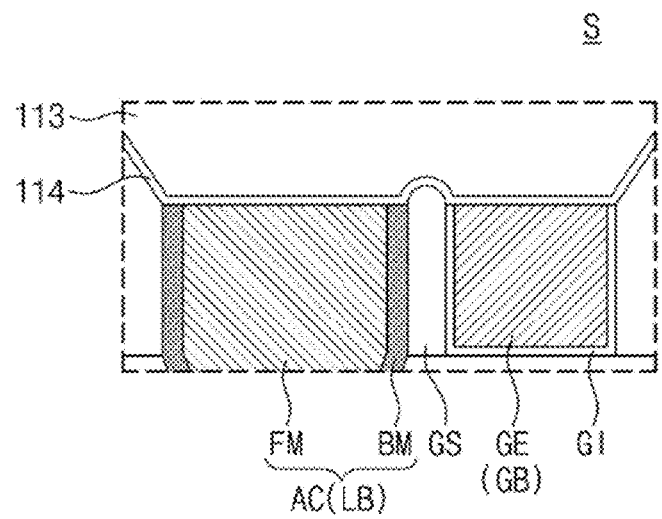
FIGS. 3D and 3E are enlarged views illustrating a region S of FIG. 2A.
Figure 3E:
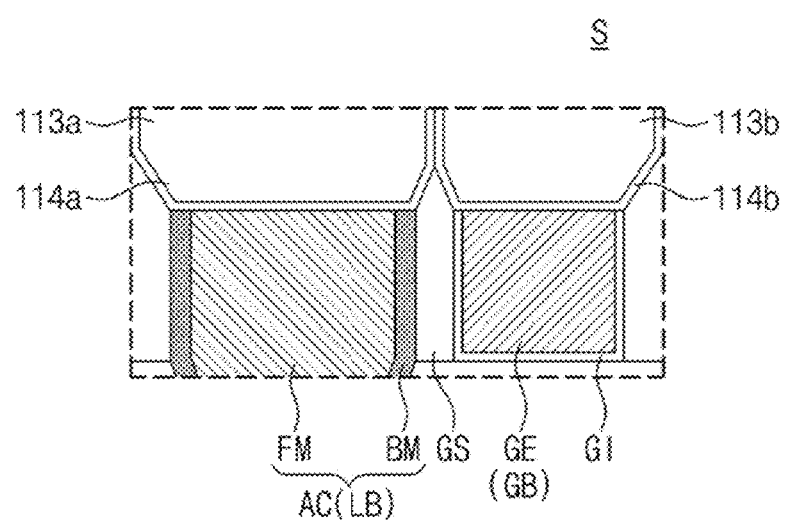

FIG. 1 is a plan view illustrating a semiconductor device according to some example embodiments of the inventive concepts. FIGS. 2A to 2E are sectional views taken along lines A-A', B-B', C-C', D-D', and E-E', respectively, of FIG. 1. FIG. 3A is a perspective view illustrating a region Q of FIG. 1. FIG. 3B is an enlarged view illustrating a region P of FIG. 2C. FIG. 3C is an enlarged view illustrating a region R of FIG. 2D. FIGS. 3D and 3E are enlarged views illustrating a region S of FIG. 2A.

Referring to FIGS. 1 and 2A to 2E, a logic cell LC may be provided on a substrate 100. Logic transistors constituting a logic circuit may be disposed on the logic cell LC. The substrate 100 may be a semiconductor substrate that is formed of or includes silicon, germanium, silicon-germanium, a compound semiconductor material, or the like. In some example embodiments, the substrate 100 may be a silicon substrate.

The logic cell LC may include a PMOSFET region PR and a NMOSFET region NR. The PMOSFET and NMOSFET regions PR and NR may be defined by a second trench TR2, which is formed in an upper portion of the substrate 100. In other words, the second trench TR2 may be placed between the PMOSFET and NMOSFET regions PR and NR. The PMOSFET and NMOSFET regions PR and NR may be spaced apart from each other, in a first direction D1, with the second trench TR2 interposed therebetween. The substrate 100 may be referred to as including the PMOSFET and NMOSFET regions PR and NR, where PMOSFET and NMOSFET regions PR and NR are adjacent to each other in the first direction D1 as shown.

A first active pattern AP1 and a second active pattern AP2 may be defined by a first trench TR1, which is formed in an upper portion of the substrate 100. The first and second active patterns AP1 and AP2 may be provided on the PMOSFET and NMOSFET regions PR and NR, respectively. The first trench TR1 may be shallower than the second trench TR2. The first and second active patterns AP1 and AP2 may be extended in a second direction D2. The first and second active patterns AP1 and AP2 may be vertically protruding portions of the substrate 100. The first and second active patterns AP1 and AP2 may be referred to as being "on" the substrate 100.

A device isolation layer ST may be provided to fill the first and second trenches TR1 and TR2. The device isolation layer ST may be formed of or include silicon oxide. Upper portions of the first and second active patterns AP1 and AP2 may protrude vertically above the device isolation layer ST (e.g., see FIG. 2D). The device isolation layer ST may not cover the upper portions of the first and second active patterns AP1 and AP2. The device isolation layer ST may cover lower side surfaces of the first and second active patterns AP1 and AP2. A liner insulating layer may be provided between the device isolation layer ST and the first and second active patterns AP1 and AP2. The liner insulating layer may be conformally provided along the first and second trenches TR1 and TR2. The liner insulating layer may be formed of or include, for example, SiN or SiON.

The first active pattern AP1 may include a first channel pattern CH1. The second active pattern AP2 may include a second channel pattern CH2. The first channel pattern CH1 and the second channel pattern CH2 may be understood to be respectively connected to the first source/drain pattern SD1 and the second source/drain pattern SD2, as shown. Each channel pattern of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other (e.g., isolated from direct contact with each other) in a vertical direction (i.e., a third direction D3).

Each of the first to third semiconductor patterns SP1, SP2, and SP3 may be formed of or include at least one of silicon (Si), germanium (Ge), or silicon-germanium (SiGe). In some example embodiments, each of the first to third semiconductor patterns SP1, SP2, and SP3 may be formed of or include crystalline silicon.

A plurality of first recesses RS1 may be formed in the upper portion of the first active pattern AP1. First source/drain patterns SD1 may be provided in the first recesses RS1, respectively, and may be understood to be on the first active pattern AP1. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3 of the first channel pattern CH1, and the first channel pattern CH1 may be understood to be connected to the pair of first source/drain patterns SD1.

A plurality of second recesses RS2 may be formed in the upper portion of the second active pattern AP2, and may be understood to be on the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, the pair of the second source/drain patterns SD2 may be connected to each other by the first to third semiconductor patterns SP1, SP2, and SP3 stacked, and the second channel pattern CH2 may be understood to be connected to the pair of second source/drain patterns SD2.

The first and second source/drain patterns SD1 and SD2 may be understood to be on the first active pattern AP1 and the second active pattern AP2, respectively. The first and second source/drain patterns SD1 and SD2 may be epitaxial patterns, which are formed by a selective epitaxial growth (SEG) process. As an example, each of the first and second source/drain patterns SD1 and SD2 may have a top surface that is located at substantially the same level as a top surface of the third semiconductor pattern SP3. However, in some example embodiments, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or include the same semiconductor material (e.g., Si) as the substrate 100. In some example embodiments, the second source/drain patterns SD2 may be formed of or include single-crystalline silicon.

Each of the first source/drain patterns SD1 may include a first semiconductor layer SEL1 and a second semiconductor layer SEL2, which are sequentially stacked. A sectional shape of the first source/drain pattern SD1 taken parallel to the second direction D2 will be described with reference to FIG. 2A.

The first semiconductor layer SEL1 may cover an inner surface of the first recess RS1. The first semiconductor layer SEL1 may have a U-shaped section, due to a sectional profile of the first recess RS1. The second semiconductor layer SEL2 may fill a remaining space of the first recess RS1 covered with the first semiconductor layer SEL1. A volume of the second semiconductor layer SEL2 may be larger than a volume of the first semiconductor layer SEL1. In other words, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of or include silicon-germanium (SiGe). In detail, the first semiconductor layer SEL1 may be provided to have a relatively low germanium concentration. In some example embodiments, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase with increasing distance in the third direction D3. For example, the germanium concentration of the second semiconductor layer SEL2 may be about 40 at % near the first semiconductor layer SEL1 but may be about 60 at % at its top level.

The first and second semiconductor layers SEL1 and SEL2 may include impurities (e.g., boron), allowing the first source/drain pattern SD1 to have the p-type conductivity. In some example embodiments, a concentration of impurities in the second semiconductor layer SEL2 (in at %) may be higher than that in the first semiconductor layer SEL1.

Gate electrodes GE (e.g., a first gate electrode GE and a second gate electrode GE) may be provided to each cross the first and second active patterns AP1 and AP2 and to each extend in the first direction D1. The gate electrodes GE may be arranged with a first pitch P1 in the second direction D2. Each of the gate electrodes GE may be vertically overlapped with the first and second channel patterns CH1 and CH2 and thus may be understood to be "on" the first and second channel patterns CH1 and CH2.

The gate electrode GE (e.g., each gate electrode GE of the aforementioned first gate electrode GE and the second gate electrode GE) may include a first portion P01 interposed between the substrate 100 and the first semiconductor pattern SP1, a second portion P02 interposed between the first semiconductor pattern SP1 and the second semiconductor pattern SP2, a third portion P03 interposed between the second semiconductor pattern SP2 and the third semiconductor pattern SP3, and a fourth portion P04 on the third semiconductor pattern SP3.

Referring back to FIG. 2A, the first to third portions P01, P02, and P03 of the gate electrode GE on the PMOSFET region PR may have different widths from each other. For example, the largest width of the third portion P03 in the second direction D2 may be larger than the largest width of the second portion P02 in the second direction D2. The largest width of the first portion P01 in the second direction D2 may be larger than the largest width of the third portion P03 in the second direction D2.

Referring back to FIG. 2D, the gate electrode GE may be provided to face top surface, bottom surface and opposite side surfaces of each of the first to third semiconductor patterns SP1, SP2, and SP3. In other words, the logic transistor according to some example embodiments may be a three-dimensional field-effect transistor (e.g., multi-bridge channel field-effect transistor (MBCFET)), in which the gate electrode GE is provided to three-dimensionally surround the channel pattern.

Referring back to FIGS. 1 and 2A to 2D, a pair of gate spacers GS may be respectively disposed on opposite side surfaces of the fourth portion P04 of the gate electrode GE. The gate spacers GS may be extended along the gate electrode GE and in the first direction D1. The gate spacers GS may include a first gate spacer GS and a second gate spacer GS on side surfaces of the first and second gate electrodes GE, respectively. The gate spacers GS may be formed of or include at least one of SiCN, SiCON, or SiN. In some example embodiments, the gate spacers GS may have a multi-layered structure, which includes at least two different materials selected from SiCN, SiCON, and SiN.

A gate insulating layer GI may be interposed between the gate electrode GE and the first channel pattern CH1 and between the gate electrode GE and the second channel pattern CH2. The gate insulating layer GI may cover top, bottom, and opposite side surfaces of each of the first to third semiconductor patterns SP1, SP2, and SP3. The gate insulating layer GI may cover a top surface of the device isolation layer ST below the gate electrode GE (e.g., see FIG. 2D). The gate insulating layer GI may include a first gate insulating layer GI and a second gate insulating layer GI, where the first gate insulating layer GI is interposed between the first channel pattern CH1 and the first gate electrode GE and where the second gate insulating layer GI is interposed between the second channel pattern CH2 and the second gate electrode GE.

In some example embodiments, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate. In some example embodiments, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In some example embodiments, the ferroelectric layer may have a thickness ranging from 0.5 to 10 nm, but the inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

In some example embodiments, the gate insulating layer GI may include a single ferroelectric layer. In some example embodiments, the gate insulating layer GI may include a plurality of ferroelectric layers, which are spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions P01, P02, and P03 of the gate electrode GE may be composed of the first metal pattern or the work function metal.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). In some example embodiments, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta). In some example embodiments, the fourth portion P04 of the gate electrode GE may include the first metal pattern and the second metal pattern on the first metal pattern.

Referring back to FIG. 2B, inner spacers IP may be provided on the NMOSFET region NR. The inner spacers IP may be respectively interposed between the second source/drain pattern SD2 and the first to third portions P01, P02, and P03 of the gate electrode GE. The inner spacers IP may be in direct contact with the second source/drain pattern SD2. Each of the first to third portions P01, P02, and P03 of the gate electrode GE may be spaced apart from the second source/drain pattern SD2 by the inner spacer IP. The inner spacers IP may be formed of or include at least one of SiN. SiCN, or SiOCN A first interlayer insulating layer 110 may be provided on the substrate 100. The first interlayer insulating layer 110 may cover the gate spacers GS and the first and second source/drain patterns SD1 and SD2. The first interlayer insulating layer 110 may cover the first source/drain pattern SD1 and the second source/drain pattern SD2. A second interlayer insulating layer 113 may be disposed on the first interlayer insulating layer 110. In some example embodiments, the first and second interlayer insulating layers 110 and 113 may be formed of or include silicon oxide.

A pair of division structures DB, which are opposite to each other in the second direction D2, may be provided at both sides of the logic cell LC. The division structure DB may be extended in the first direction D1 and parallel to the gate electrodes GE. A pitch between the division structure DB and the gate electrode GE adjacent thereto may be equal to the first pitch P1.

The division structure DB may be provided to penetrate the first and second interlayer insulating layers 110 and 113 and may be extended into the first and second active patterns AP1 and AP2. The division structure DB may penetrate an upper portion of each of the first and second active patterns AP1 and AP2. The division structure DB may separate the first and second active patterns AP1 and AP2 of the logic cell LC from an active region of another logic cell adjacent thereto.

Sacrificial layers SAL adjacent to the division structure DB may be provided on each of the first and second active patterns AP1 and AP2. The sacrificial layers SAL may be stacked to be spaced apart from each other. Each of the sacrificial layers SAL may be located at the same level as a corresponding one of the first to third portions P01, P02, and P03 of the gate electrode GE. The division structure DB may be provided to penetrate the sacrificial layers SAL.

In the present specification, the term 'level' may mean a vertical height and/or a distance from a reference location in a vertical direction (e.g., the top and/or bottom surface of the substrate 100 in the third direction D3). Therefore, when a first element is described herein to be at a higher level than a second element, the first element may be further from the bottom surface of the substrate 100 in the third direction D3 than the second element. Furthermore, when a first element is described herein to be at a lower level than a second element, the first element may be closer to the bottom surface of the substrate 100 in the third direction D3 than the second element. Furthermore, when a first element is described herein to be at a same or substantially same level as a second element, the first element may be equally distant from/close to the bottom surface of the substrate 100 in the third direction D3 as the second element.

The sacrificial layers SAL may be formed of or include silicon-germanium (SiGe). A germanium concentration in each of the sacrificial layers SAL may range from 10 at % to 30 at %. The germanium concentration of the sacrificial layer SAL may be higher than the germanium concentration of the first semiconductor layer SEL1 described above.

Active contacts AC may be provided to penetrate the first and second interlayer insulating layers 110 and 113 and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is elongated in the first direction D1. The active contacts AC, which are arranged in the first direction D1, may be spaced apart from each other with fence patterns 111 interposed therebetween, as shown in FIG. 2C. As shown in FIG. 2C, the active contacts Ac may be on the first and second source/drain patterns SD1 and SD2. The fence patterns 111 may be formed of or include at least one of $SiO_2$, SiN, SiC, SiOC, or $AlO_x$.

The active contact AC may be a self-aligned contact. In other words, the active contact AC may be formed by a self-alignment process using the gate electrode GE and the gate spacer GS. For example, the active contact AC may cover at least a portion of the side surface of the gate spacer GS.

The active contact AC may include a conductive pattern FM and a barrier pattern BM enclosing the conductive pattern FM. The conductive pattern FM may be formed of or include at least one of metallic materials (e.g., aluminum, copper, tungsten, molybdenum, or cobalt). The barrier pattern BM may cover side and bottom surfaces of the conductive pattern FM. In some example embodiments, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

Hereinafter, the active contact AC will be described in more detail with reference to FIGS. 3A and 3B. The active contact AC may include a contact body portion LB and a contact protruding portion LA. The contact body portion LB may be a bar-shaped pattern, which is extended in the first direction D1, and may have a first top surface TS1, which is located at a first height. The contact protruding portion LA may have a shape which protrudes from the first top surface TS1 of the contact body portion LB in the third direction D3. The contact protruding portion LA may have a second top surface TS2, which is located at a second height. The second top surface TS2 of the contact protruding portion LA may be in direct contact with a first metal layer M1 (e.g., a bottom surface of a first lower interconnection line M1_I1). In other words, a top surface of the active contact AC may be directly connected to the first lower interconnection line M1_I1 without an additional structure interposed therebetween. Accordingly, at least the first lower interconnection line M1_I1 may be understood to be on the active contact AC. In some example embodiments, active contacts AC may be on the first and second source/drain patterns SD1 and SD2, respectively. Each of the active contacts AC may include a contact body portion LB and a contact protruding portion LA that protrudes from a top surface of the contact body portion LB and is in contact with a bottom surface of a corresponding one of the first lower interconnection lines (e.g., a corresponding one of the first to fifth lower interconnection lines M1_I1 to M1_I5).

The first metal layer M1 may be provided in a third interlayer insulating layer 130. The first metal layer M1 may be provided on the first and second gate electrodes GE. The first metal layer M1 may include first to fifth lower interconnection lines M1_I1 to M1_I5 and sixth and seventh lower interconnection lines M1_R1 and M1_R2 (also collectively and/or separately referred to herein as "first interconnection lines"). Each of the lower interconnection lines M1_I1 to M1_I5, M1_R1, and M1_R2 may be extended in the second direction D2 to cross the logic cell LC. In some example embodiments, a drain voltage VDD or a source voltage VSS may be applied to the sixth and seventh lower interconnection lines M1_R1 and M1_R2.

As shown in at least FIGS. 3A-3C, the contact protruding portion LA may include a first stepwise structure SK1, at which a slope of a side surface of the contact protruding portion LA is discontinuously changed. As an example, the contact protruding portion LA may include a recessed side surface. In detail, a lower side surface of the contact protruding portion LA connected to the contact body portion LB may be defined by a first recess region RR1, and an upper side surface of the contact protruding portion LA connected to the first lower interconnection line M1_I1 may be defined by a second recess region RR2. The first and second recess regions RR1 and RR2 may be empty spaces, which are formed by partially removing an upper portion of the active contact AC and are not connected to the first metal layer M1. The first stepwise structure SK1 may be defined near a boundary between the first and second recess regions RR1 and RR2. The second interlayer insulating layer 113 may be provided to fill the first recess region RR1. A liner insulating layer 114 may be provided between the second interlayer insulating layer 113 and the contact body portion LB, but the inventive concepts are not limited to this example. The third interlayer insulating layer 130 may be provided on the second interlayer insulating layer 113 to fill the second recess region RR2. The second recess region RR2 may be formed during a patterning process for forming the first lower interconnection line M1_I1 and may be aligned to a side surface of the first lower interconnection line M1_I1. As an example, a width of the second top surface TS2 of the contact protruding portion LA in the first direction D1 may be substantially equal to a width of a bottom surface of the first lower interconnection line M1_I1.

The third interlayer insulating layer 130 may be extended into a region between the lower interconnection lines. For example, a bottom surface of the third interlayer insulating layer 130 may be lower than a bottom surface of the first metal layer M1. Each of the second interlayer insulating layer 113, the third interlayer insulating layer 130, and the liner insulating layer 114 may be formed of or include at least one of $SiO_2$, SiN, SiC, SiOC, or $AlO_x$.

The contact body portion LB and the contact protruding portion LA may be provided to have no interface therebetween and to form a single object. In other words, the contact body portion LB and the contact protruding portion LA may be two portions of a structure that is simultaneously formed of the same material (e.g., two portions of a single, unitary piece of material). The barrier pattern BM may be extended from a region on side surface of the contact body portion LB to a region on a side surface of the contact protruding portion LA.

Hereinafter, the gate electrode GE will be described in more detail with reference to FIGS. 3A and 3C. The gate electrode GE may include a gate body portion GB (also referred to herein as an electrode body portion) and a gate protruding portion GC (also referred to herein as an electrode protruding portion). The gate body portion GB may be a line- or bar-shaped pattern, which is extended in the first direction D1, and may have a third top surface TS3, which is located at a third height. The gate protruding portion GC may have a shape which protrudes from the third top surface TS3 of the gate body portion GB in the third direction D3. The gate protruding portion GC may have a fourth top surface TS4, which is located at a fourth height. The fourth top surface TS4 of the gate protruding portion GC may be in direct contact with the first metal layer M1 (e.g., a bottom surface of a fourth lower interconnection line M1_I4). In other words, a top surface of the gate electrode GE may be directly connected to the fourth lower interconnection line M1_I4 without an additional structure interposed therebetween. In some example embodiments, at least the fourth lower interconnection line M1_I4 may be understood to be on the gate electrode GE. In some example embodiments, each of the first and second gate electrodes GE may include a gate body portion GB and a gate protruding portion GC that protrudes from a top surface of the gate body portion GB and is in contact with a bottom surface of a separate first lower interconnection line (e.g., a separate one of the first to fifth lower interconnection lines M1_I1 to M1_I5).

As shown in at least FIGS. 3A-3C, the gate protruding portion GC may include a second stepwise structure SK2, at which a slope of a side surface of the gate protruding portion GC is discontinuously changed. As an example, the gate protruding portion GC may include a recessed side surface. In detail, a lower side surface of the gate protruding portion GC connected to the gate body portion GB may be defined by a third recess region RR3, and an upper side surface of the gate protruding portion GC connected to the fourth lower interconnection line M1_I4 may be defined by a fourth recess region RR4. The third and fourth recess regions RR3 and RR4 may be empty spaces, which are formed by partially removing an upper portion of the gate electrode GE and are not connected to the first metal layer M1. The second stepwise structure SK2 may be defined near a boundary between the third and fourth recess regions RR3 and RR4. The second interlayer insulating layer 113 may be provided to fill the third recess region RR3. The liner insulating layer 114 may be provided between the second interlayer insulating layer 113 and the gate body portion GB, however, the inventive concepts are not limited to this example. The third interlayer insulating layer 130 may be provided on the second interlayer insulating layer 113 to fill the fourth recess region RR4. The fourth recess region RR4 may be formed during a patterning process for forming the fourth lower interconnection line M1_I4 and may be aligned to a side surface of the fourth lower interconnection line M1_I4. Accordingly, the gate protruding portion GC may comprise a side surface (e.g., which at least partially defines the fourth recess region RR4) that is aligned to a side surface of the fourth lower interconnection line M1_I4. As an example, a width of the fourth top surface TS4 of the gate protruding portion GC in the first direction D1 may be substantially equal to a width of a bottom surface of the fourth lower interconnection line M1_I4.

The gate body portion GB and the gate protruding portion GC may be provided to have no interface therebetween and to form a single object. In other words, the gate body portion GB and the gate protruding portion GC may be two portions of a structure that is simultaneously formed of the same material (e.g., two portions of a single, unitary piece of material). The gate insulating layer GI may be extended from a region on a side surface of the gate body portion GB to a region on a side surface of the gate protruding portion GC.

As shown in FIG. 3B, the contact protruding portion LA of the active contact AC may be adjacent to the gate protruding portion GC of the gate electrode GE connected to a second lower interconnection line M1_I2. In more detail, the second top surface TS2 of the contact protruding portion LA, which is connected to the first lower interconnection line M1_I1, may be spaced apart from the fourth top surface TS4 of the gate protruding portion GC, which is connected to the second lower interconnection line M1_I2, by a first distance d1. The first lower interconnection line M1_I1 and the second lower interconnection line M1_I2 may be interconnection lines, which are extended in a direction crossing an extension direction of the gate electrodes GE or in the second direction D2 and are adjacent and parallel to each other.

Referring to at least FIGS. 2A-3C, the first lower interconnection line M1_I1 may be on (e.g., directly or indirectly on) the gate electrode GE, and the second lower interconnection line M1_I2 may be on (e.g., directly or indirectly on) the active contact AC and may be at a same level as the first lower interconnection line M1_I1, where the gate electrode GE may include the gate body portion GB and the gate protruding portion GC, where the gate protruding portion GB protrudes from a top surface of the gate body portion GB (e.g., TS3) and is in contact with a bottom surface of the first lower interconnection line M1_I1, and where the active contact AC includes a contact body portion LB and a contact protruding portion LA, where the contact protruding portion LA protrudes from a top surface of the contact body portion LB (e.g., TS1) and is in contact with a bottom surface of the second lower interconnection line M1_I2. As shown, the gate protruding portion GC may comprise a side surface aligned to (e.g., at least partially coplanar with, e.g., at an interface therebetween) a side surface of the first lower interconnection line M1_I1. As shown, the first lower interconnection line M1_I1 and the second lower interconnection line M1_I2 may extend (e.g., may be extended) in a direction crossing an extension direction of the gate electrode GE and may be parallel to each other.

Similarly, as shown in FIG. 3C, the gate protruding portion GC of the gate electrode GE may be adjacent to the contact protruding portion LA connected to the fifth lower interconnection line M1_I5. In more detail, the fourth top surface TS4 of the gate protruding portion GC, which is connected to the fourth lower interconnection line M1_I4, may be spaced apart from the second top surface TS2 of the contact protruding portion LA, which is connected to the fifth lower interconnection line M1_I5, by a second distance d2. The second distance d2 and the first distance d1 may be equal to each other or may be different from each other. The first top surface TS1 may be located at the same level as the third top surface TS3, but the inventive concepts are not limited to this example. The second top surface TS2 (which may be considered to be a top surface of the gate protruding portion GC) may be located at the same level as the fourth top surface TS4 (which may be considered to be a top surface of the contact protruding portion LA), but the inventive concepts are not limited to this example. As shown, at least the first lower interconnection line M1_I1 that is on (e.g., directly on) the active contact AC may be at a same level as the fourth lower interconnection line M1_I4 that is on (e.g., directly on) the gate electrode GE.

As an integration density of a semiconductor device increases, a distance between the active contact AC and the gate electrode GE may decrease, and thus, there is an increasing risk of a process failure, such as unintended connection between vias or contacts. According to some example embodiments of the inventive concepts, by forming the contact protruding portion LA from an upper portion of the active contact AC and forming the gate protruding portion GC from an upper portion of the gate electrode GE, it may be possible to easily connect the active contact AC and the gate electrode GE to lower interconnection lines, without an additional via or contact for connection with the lower interconnection lines. Accordingly, it may be possible to prevent a misalignment issue or a connection failure, which may occur when the additional via or contact is formed. In addition, due to the recess regions, it may be possible to separate the contact protruding portion LA from the gate protruding portion GC by a sufficient large distance and thereby to prevent a process defect (e.g., a contact or short issue between the contact protruding portion LA and the gate protruding portion GC).

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, or cobalt silicide).

Referring to FIGS. 3D and 3E, the gate spacer GS between the gate electrode GE and the active contact AC may protrude above a top surface of the contact body portion LB and/or a top surface of the gate body portion GB in the third direction D3. However, in some example embodiments, a top surface of the gate spacer GS may be located at a level that is equal to or lower than the top surface of the contact body portion LB and/or the top surface of the gate body portion GB. The second interlayer insulating layer 113 and the liner insulating layer 114 may be provided to cover the contact body portion LB and the gate body portion GB. In some example embodiments, the second interlayer insulating layer 113 may cover the top surface of the gate body portion GB and a side surface of the gate protruding portion GC, and the second interlayer insulating layer 113 may cover the top surface of the contact body portion LB and a side surface of the contact protruding portion LA. In some example embodiments, the contact body portion LB and the gate body portion GB may be covered in common with the second interlayer insulating layer 113 and the liner insulating layer 114, as shown in FIG. 3D. Alternatively, the liner insulating layer 114a and the second interlayer insulating layer 113a covering the contact body portion LB may be different from the liner insulating layer 114b and the second interlayer insulating layer 113b covering the gate body portion GB, as shown in FIG. 3E. Accordingly, the second interlayer insulating layer 113a on the contact body portion LB may be spaced apart from the second interlayer insulating layer 113b on the gate body portion GB with the liner insulating layers 114a and 114b interposed therebetween. For example, the second interlayer insulating layer 113b may cover the top surface of the gate body portion GB and a side surface of the gate protruding portion GC, the second interlayer insulating layer 113a may cover the top surface of the contact body portion LB and a side surface of the contact protruding portion LA, and at least one liner insulating layer (e.g., 114a and/or 114b) may be between the second interlayer insulating layer 113a and the second interlayer insulating layer 113b. The at least one liner insulating layer (e.g., 114a and/or 114b) may isolate the second interlayer insulating layers 113a and 113b from direct contact with each other.

Referring back to FIG. 1, a first cell boundary CB1, which is extended in the second direction D2, may be defined in a portion of the logic cell LC. A second cell boundary CB2, which is extended in the second direction D2, may be defined in another portion of the logic cell LC, which is opposite to the first cell boundary CB1. The sixth lower interconnection line M1_R1, to which the drain voltage VDD (i.e., a power voltage) is applied, may be disposed on the first cell boundary CB1. The sixth lower interconnection line M1_R1 applied with the drain voltage VDD may be extended along the first cell boundary CB1 and in the second direction D2. The seventh lower interconnection line M1_R2, to which the source voltage VSS (i.e., a ground voltage) is applied, may be disposed on the second cell boundary CB2. The seventh lower interconnection line M1_R2 applied with the source voltage VSS may be extended along the second cell boundary CB2 and in the second direction D2. The first to fifth lower interconnection lines M1_I1 to M1_I5 may be arranged with a second pitch P2 in the first direction D1. The second pitch P2 may be smaller than the first pitch P1.

A second metal layer M2 may be provided in a fourth interlayer insulating layer 140. The second metal layer M2 may include upper interconnection lines M2_I. The second metal layer M2 may be provided on the first metal layer M1. The second metal layer M2 may include second interconnection lines (e.g., upper connection lines M2_I) electrically connected to first lower interconnection lines (e.g., at least two of the first to fifth lower interconnection lines M1_I1 to M1_I5), respectively. Each of the upper interconnection lines M2_I may be a line- or bar-shaped pattern extending in the first direction D1. In other words, the upper interconnection lines M2_I may be extended in the first direction D1 and may be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1. The third pitch P3 may be larger than the second pitch P2.

The second metal layer M2 may further include upper vias VI. The upper vias VI may be provided below the upper interconnection lines M2_I. The upper vias VI may connect the lower interconnection lines to the upper interconnection lines M2_I. The upper interconnection line M2_I of the second metal layer M2 and the upper via VI thereunder may be formed by the same process and may form a single object.

The lower interconnection lines M1_R1, M1_R2, and M1_I1 to M1_I5 of the first metal layer M1 and the upper interconnection lines M2_I of the second metal layer M2 may include the same conductive material or may include conductive materials different from each other. For example, the lower interconnection lines M1_R1, M1_R2, and M1_I1 to M1_I5 and the upper interconnection lines M2_I may be formed of or include at least one of metallic materials (e.g., aluminum, copper, tungsten, molybdenum, and cobalt).

In some example embodiments, although not shown, additional metal layers (e.g., M3, M4, M5, and so forth) may be further stacked on the fourth interlayer insulating layer 140. Each of the stacked metal layers may include routing lines constituting an interconnection structure.

FIGS. 4A to 12D are sectional views illustrating a method of fabricating a semiconductor device, according to some example embodiments of the inventive concepts. In detail, FIGS. 4A, 5A, 6A, 7A, 8A, 9A, 10A, 11A, and 12A are sectional views corresponding to the line A-A' of FIG. 1. FIGS. 5B, 6B, and 7B are sectional views corresponding to the line B-B' of FIG. 1. FIGS. 5C, 6C, 7C, 8B, 9B, 10C, 11C, and 12C are sectional views corresponding to the line C-C' of FIG. 1. FIGS. 4B, 5D, 6D, 7D, 8C, 9C, 10D, 11D, and 12D are sectional views corresponding to the line D-D' of FIG. 1. FIGS. 10B, 11B, and 12B are sectional views corresponding to the line E-E' of FIG. 1.

Figure 4A:
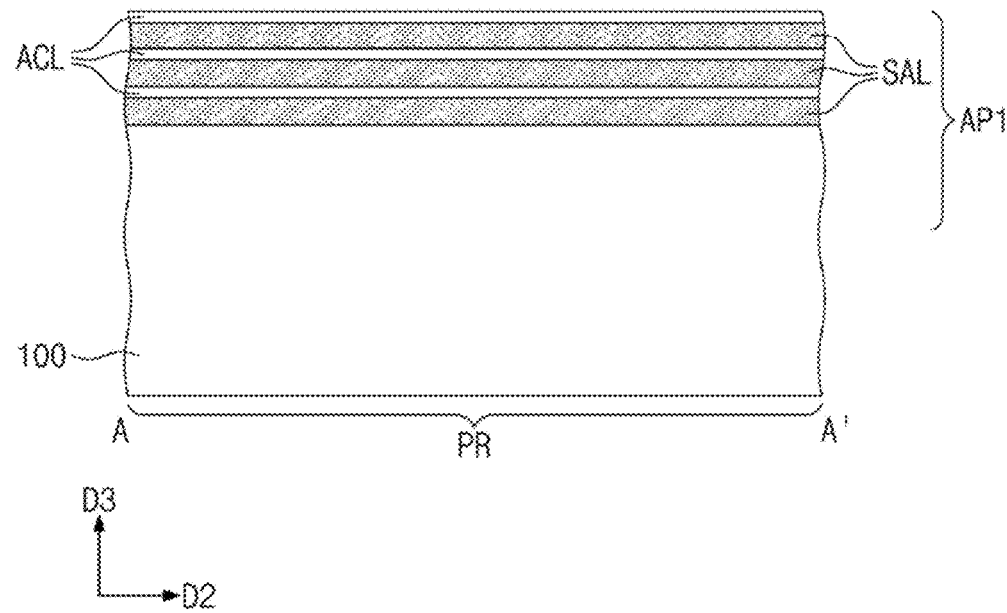
FIGS. 4A, 4B, 5A, 5B, 5C, 5D, 6A, 6B, 6C, 6D, 7A, 7B, 7C, 7D, 8A, 8B, 8C, 9A, 9B, 9C, 10A, 10B, 10C, 10D, 11A, 11B, 11C, 11D, 12A, 12B, 12C, and 12D are sectional views illustrating a method of fabricating a semiconductor device, according to some example embodiments of the inventive concept
Figure 4B:
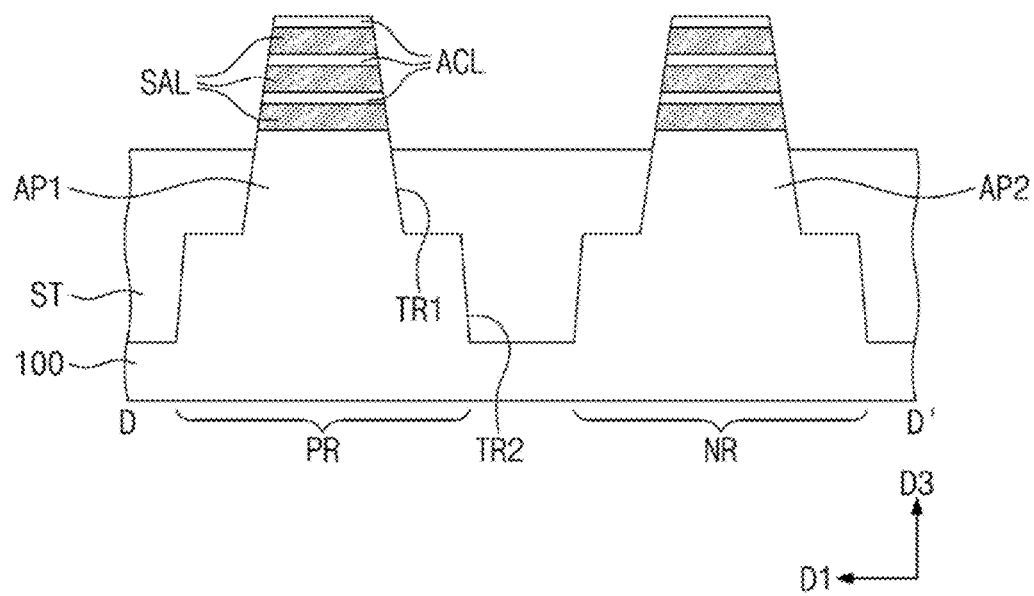
Figure 5A:
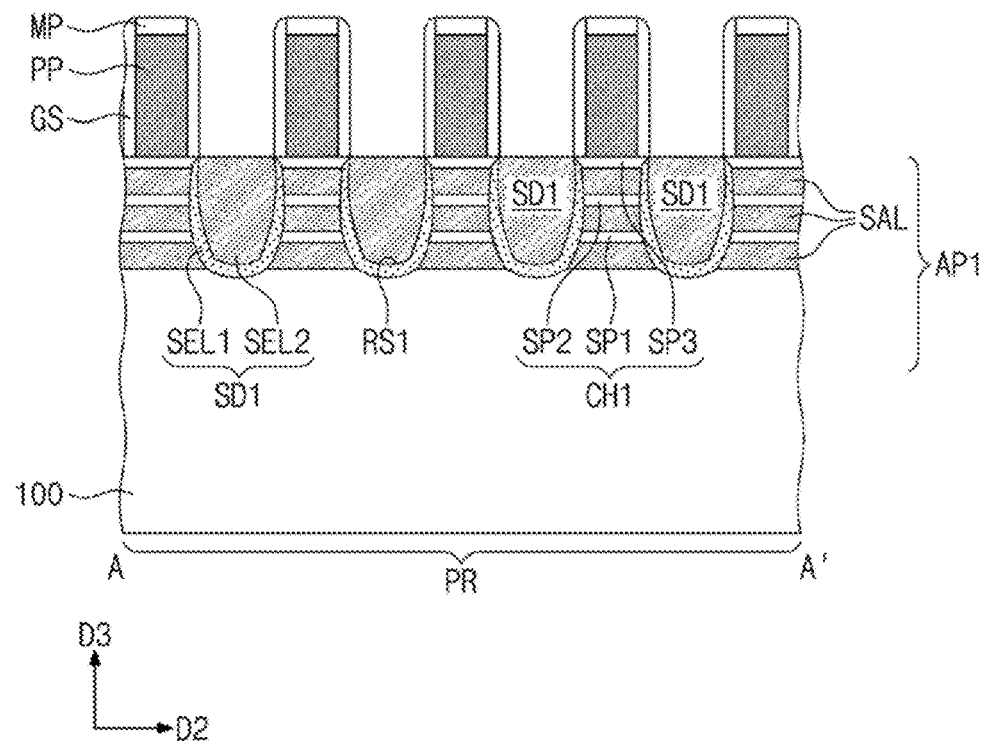
Figure 5B:
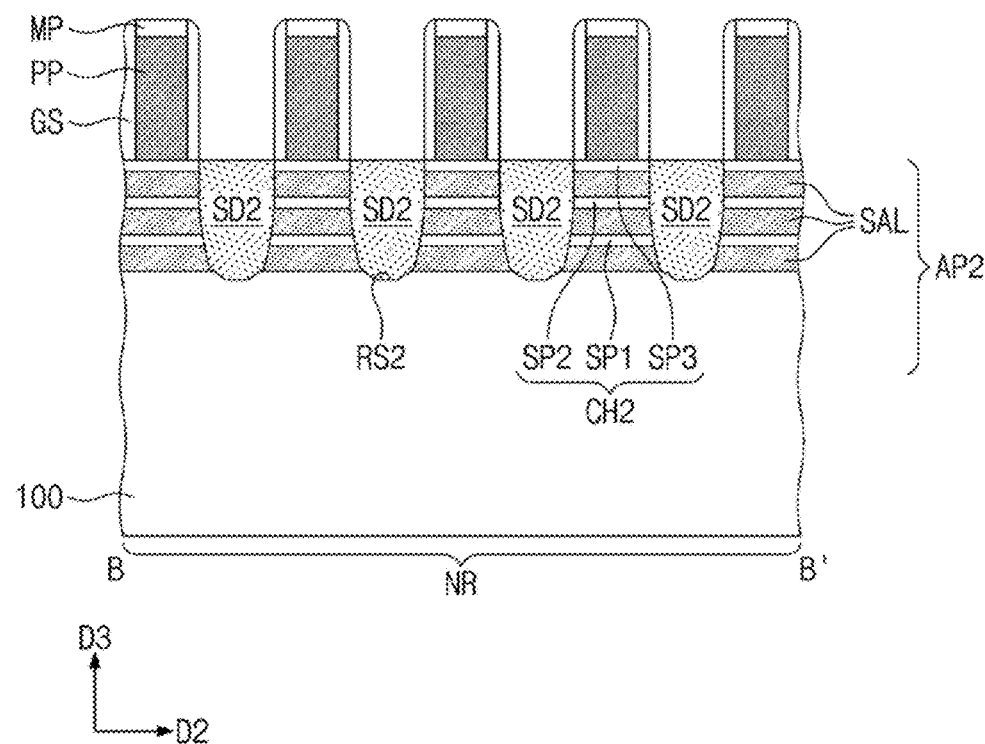
Figure 5C:
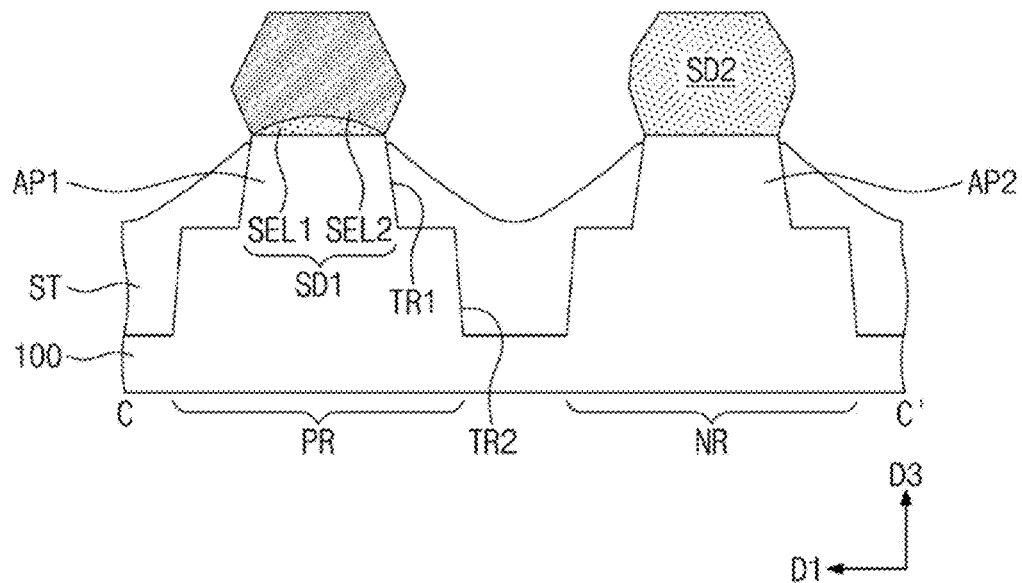
Figure 5D:
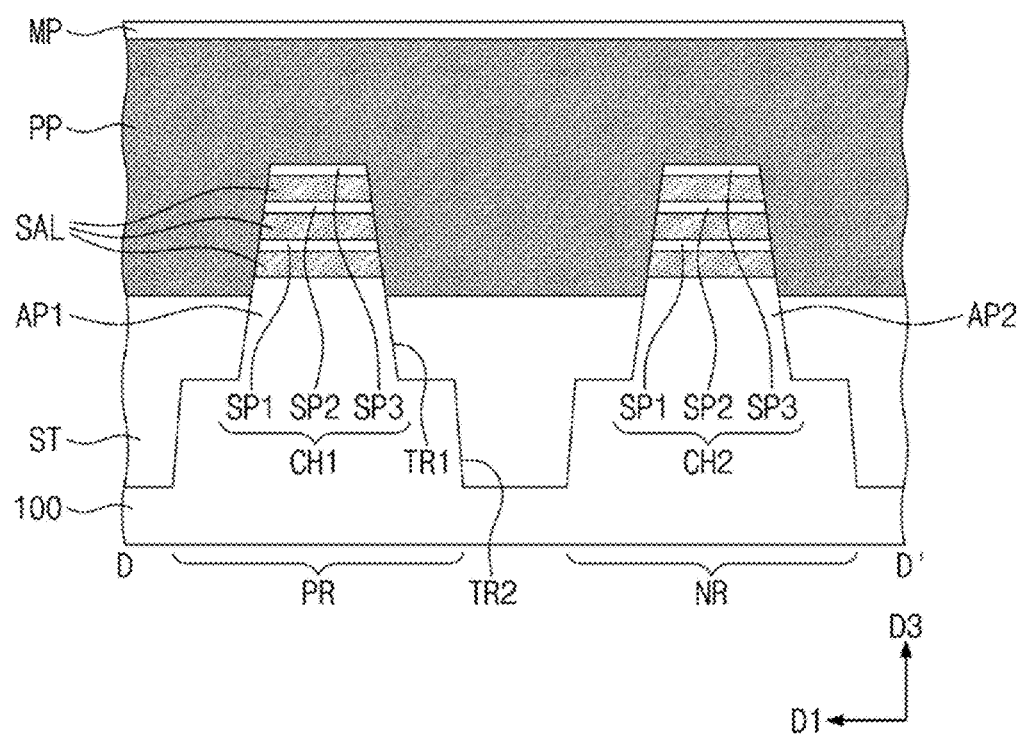
Figure 6A:
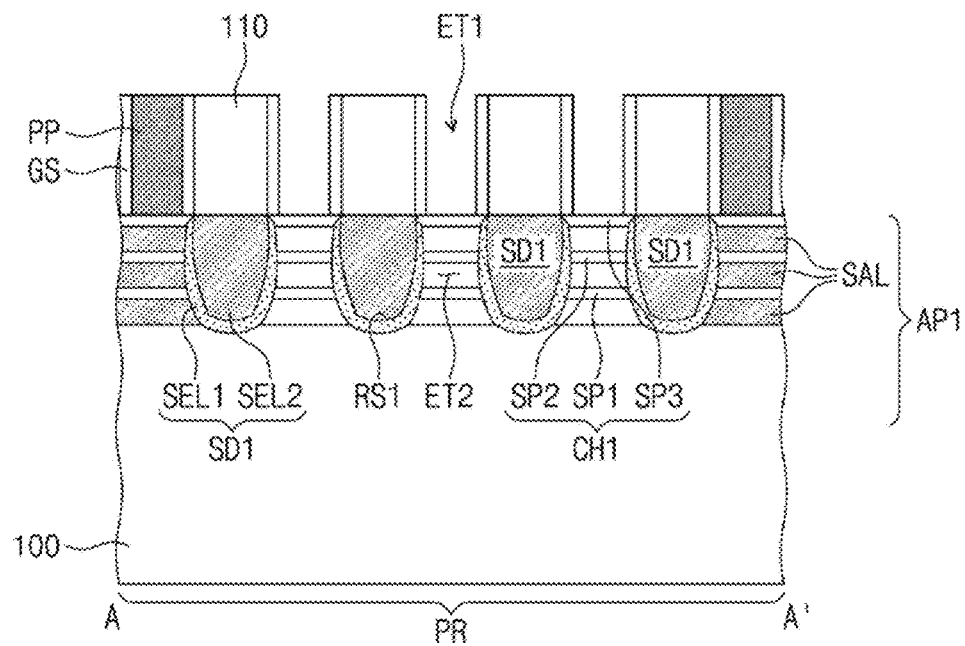
Figure 6B:
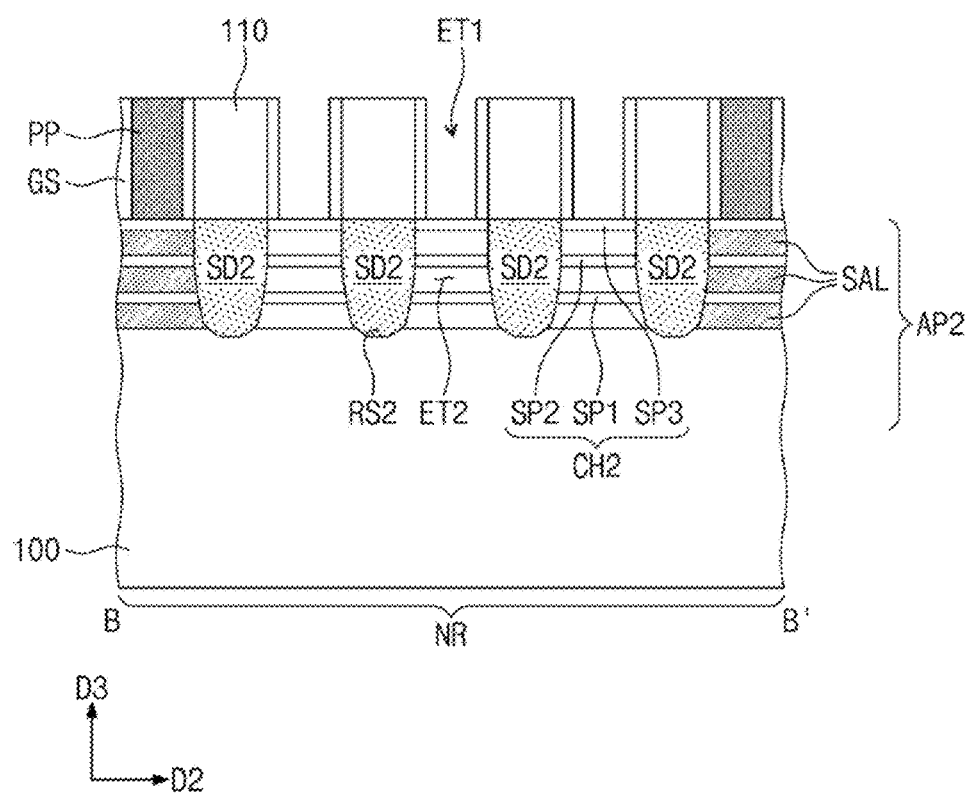
Figure 6C:
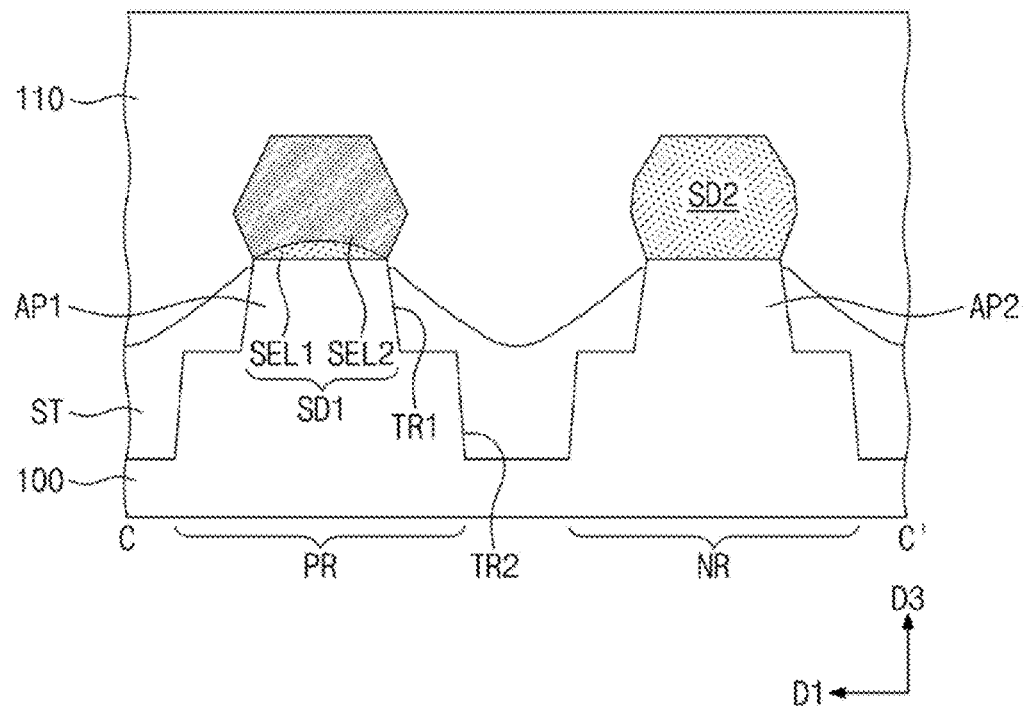
Figure 6D:
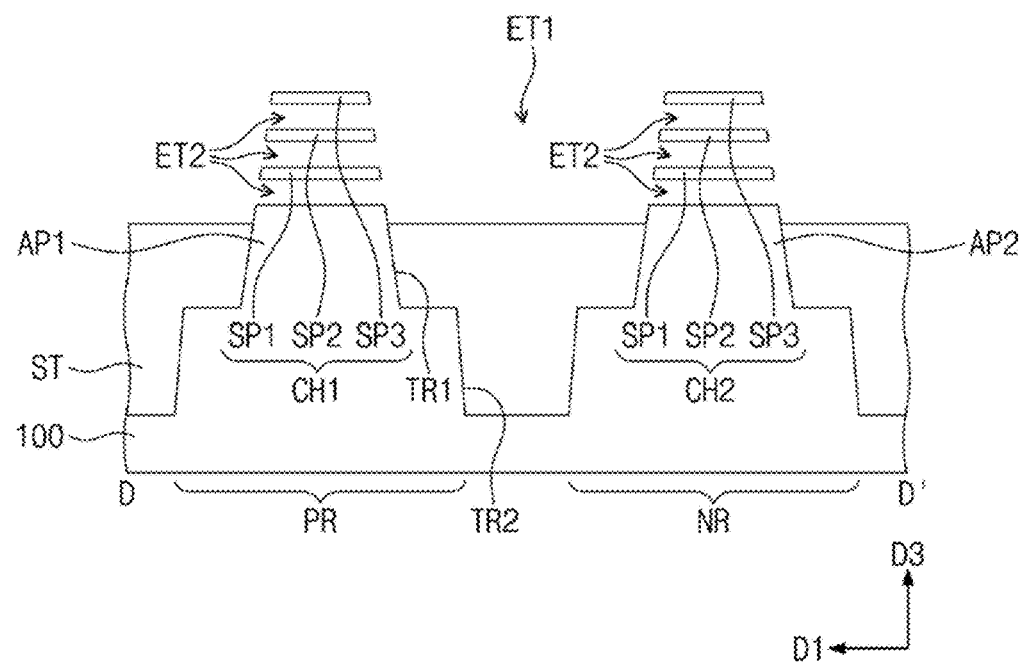
Figure 7A:
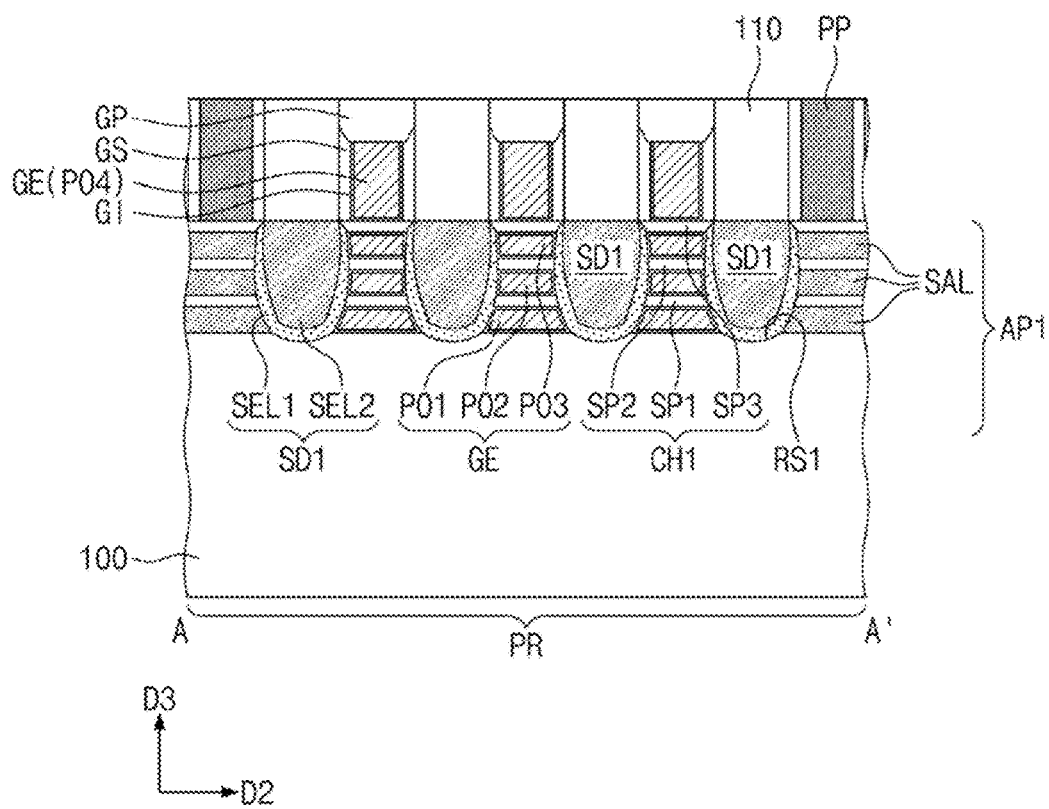
Figure 7B:
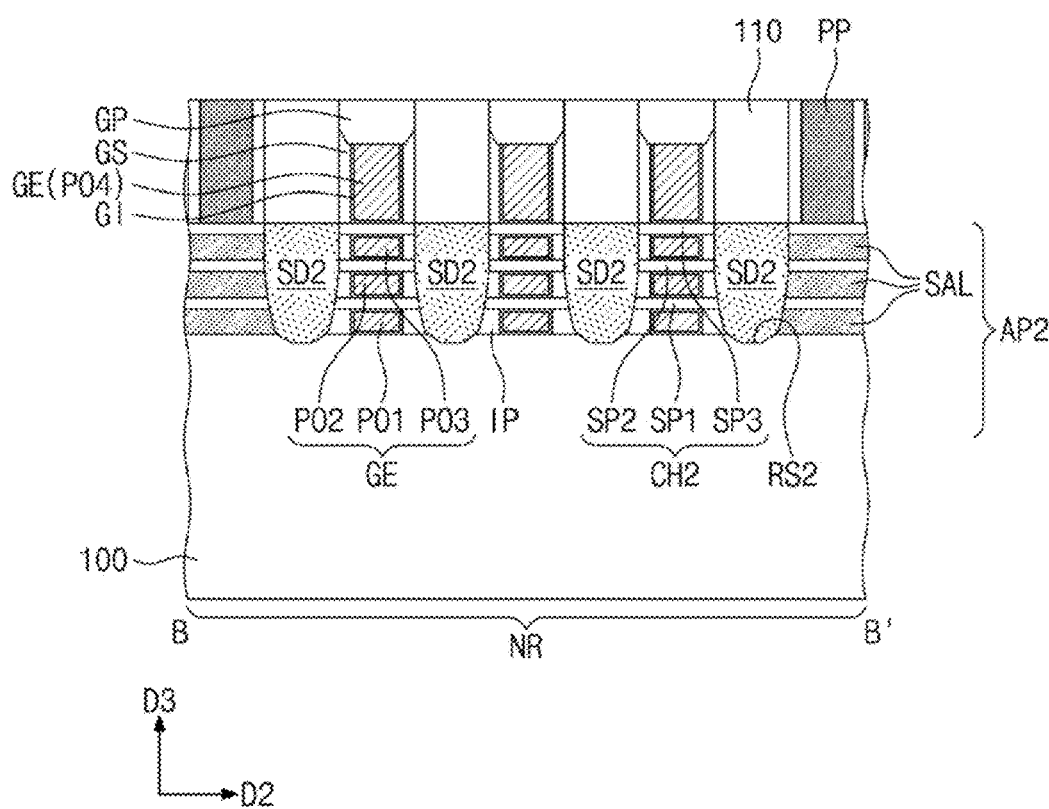
Figure 7C:
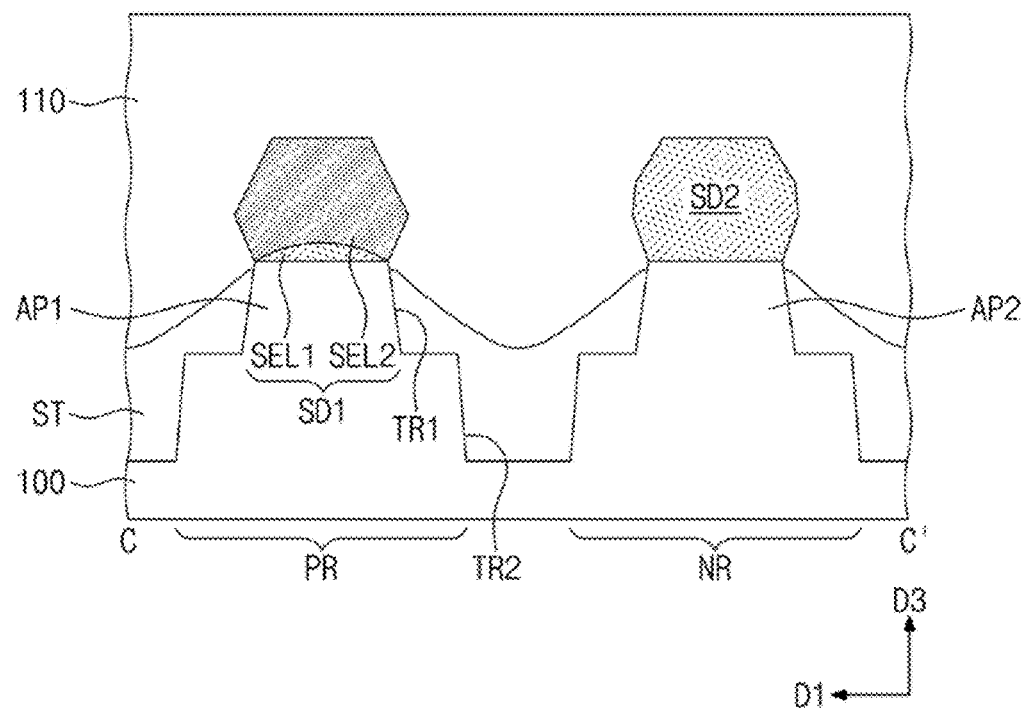
Figure 7D:
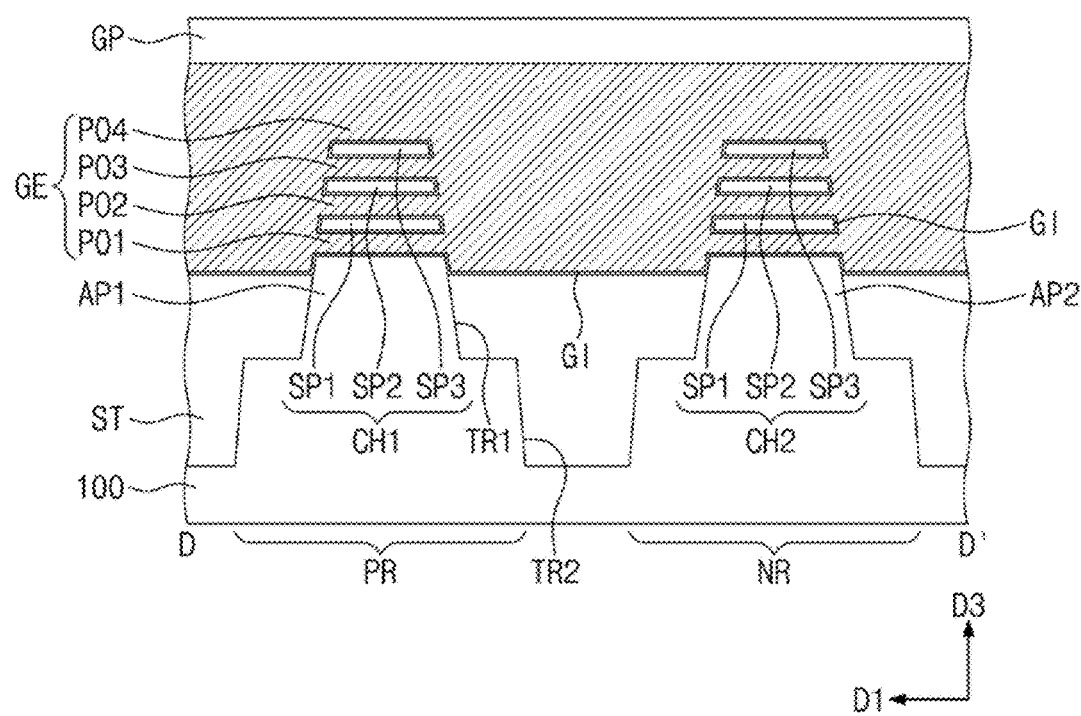

Referring to FIGS. 1, 4A, and 4B, the substrate 100 including the PMOSFET and NMOSFET regions PR and NR may be provided. The sacrificial layers SAL and active layers ACL may be alternately stacked on the substrate 100. The sacrificial layers SAL may be formed of or include one of silicon (Si), germanium (Ge), or silicon-germanium (SiGe), and the active layers ACL may be formed of or include another one of silicon (Si), germanium (Ge), or silicon-germanium (SiGe). For example, the sacrificial layers SAL may be formed of or include silicon-germanium (SiGe), and the active layers ACL may be formed of or include silicon (Si). A germanium concentration of each of the sacrificial layers SAL may range from 10 at % to 30 at %.

Mask patterns may be respectively formed on the PMOSFET and NMOSFET regions PR and NR of the substrate 100. The mask pattern may be a line- or bar-shaped pattern extending in the second direction D2. A first patterning process, in which the mask patterns are used as an etch mask, may be performed to form the first trench TR1 defining the first and second active patterns AP1 and AP2. The first and second active patterns AP1 and AP2 may be formed on the PMOSFET and NMOSFET regions PR and NR, respectively. Each of the first and second active patterns AP1 and AP2 may include the sacrificial and active layers SAL and ACL, which are provided in an upper portion thereof and are alternately stacked.

A second patterning process may be performed on the substrate 100 to form the second trench TR2 defining the PMOSFET and NMOSFET regions PR and NR. The substrate 100 may be referred to as having the PMOSFET and NMOSFET regions PR and NR, where PMOSFET and NMOSFET regions PR and NR are adjacent to each other as shown. The second trench TR2 may be formed to be deeper than the first trench TR1. Thereafter, the device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed. The device isolation layer ST may be formed of or include at least one of insulating materials (e.g., silicon oxide). Each of the first and second active patterns AP1 and AP2 may include an upper portion protruding above the device isolation layer ST.

Referring to FIGS. 5A to 5D, sacrificial patterns PP may be formed on the substrate 100 to cross the first and second active patterns AP1 and AP2. Each of the sacrificial patterns PP may be a line- or bar-shaped pattern that is extended in the first direction D1. The sacrificial patterns PP may be arranged, with a specific pitch, in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include poly silicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. Alternatively, the gate spacer layer may be a multi-layered structure including at least two of SiCN, SiCON, or SiN.

The first recesses RS1 may be formed in an upper portion of the first active pattern AP1. Portions of the device isolation layer ST, which are located at both sides of each of the first active patterns AP1, may be recessed during the formation of the first recesses RS1. The first recesses RS1 may be formed by etching an upper portion of the first active pattern AP1 using the hard mask patterns MP and the gate spacers GS as an etch mask. The first source/drain patterns SD1 may be formed in the first recesses RS1, respectively. Specifically, a first SEG process, in which an inner surface of the first recess RS1 is used as a seed layer, may be performed to form a first semiconductor layer SEL1. The first semiconductor layer SEL1 may be grown using the first to third semiconductor patterns SP1, SP2, and SP3 and the substrate 100, which are exposed through the first recesses RS1, as a seed. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be formed to have a relatively low germanium concentration. In some example embodiments, the first semiconductor layer SEL1 may contain only silicon (Si), not germanium (Ge). The germanium concentration of the first semiconductor layer SEL1 may range from 0 at % to 10 at %.

The second semiconductor layer SEL2 may be formed by performing a second SEG process on the first semiconductor layer SEL1. The second semiconductor layer SEL2 may be formed to completely fill the first recess RS1. The second semiconductor layer SEL2 may be formed to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities through an ion injection process, after the formation of the first source/drain pattern SD1. The first source/drain pattern SD1 may be doped to have a first conductivity type (e.g., p-type).

The second recesses RS2 may be formed in an upper portion of the second active pattern AP2. The second source/drain patterns SD2 may be formed in the second recesses RS2, respectively. Specifically, the second source/drain pattern SD2 may be formed by a SEG process using an inner surface of the second recess RS2 as a seed layer. In some example embodiments, the second source/drain pattern SD2 may be formed of or include the same semiconductor material (e.g., Si) as the substrate 100. The second source/drain pattern SD2 may be doped to have a second conductivity type (e.g., n-type).

Referring to FIGS. 6A to 6D, the first interlayer insulating layer 110 may be formed to cover the first source/drain pattern SD1 and the second source/drain pattern SD2, and then, a planarization process may be performed on the first interlayer insulating layer 110 to expose at least a portion of the sacrificial patterns PP. Next, upper trenches ET1 may be formed to expose side surfaces of the sacrificial layers SAL. The sacrificial layers SAL, which are provided on the PMOSFET and NMOSFET regions PR and NR and are exposed through the upper trenches ET1, may be selectively removed. In detail, an etching process of selectively etching only the sacrificial layers SAL may be performed to remove only the sacrificial layers SAL and to leave the first to third semiconductor patterns SP1, SP2, and SP3. Since the sacrificial layers SAL are selectively removed, only the first to third semiconductor patterns SP1, SP2, and SP3 may be left on each of the first and second active patterns AP1 and AP2. Hereinafter, empty regions, which are formed by removing the sacrificial layers SAL, will be referred to as third recesses ET2. The third recesses ET2 may be defined between the first to third semiconductor patterns SP1, SP2, and SP3.

Referring to FIGS. 7A to 7D, the inner spacers IP may be formed in the third recesses ET2. In some example embodiments, the inner spacers IP may be formed by forming an insulating layer to cover the second source/drain patterns SD2 and performing an etching process on the insulating layer. The inner spacers IP may be formed of or include at least one of $SiO_2$, SiN, SiC, SiOC, or $AlO_x$.

The gate insulating layer GI may be conformally formed in the upper trenches ET1 and the third recesses ET2. The gate electrode GE may be formed on the gate insulating layer GI. The gate electrode GE may be formed to fill the upper trenches ET1 and the third recesses ET2. In detail, the gate electrode GE may include the first to third portions P01, P02, and P03 filling the third recesses ET2. The gate electrode GE may further include the fourth portion P04 filling the upper trench ET1. A gate capping pattern GP may be formed on the gate electrode GE.

Figure 8A:
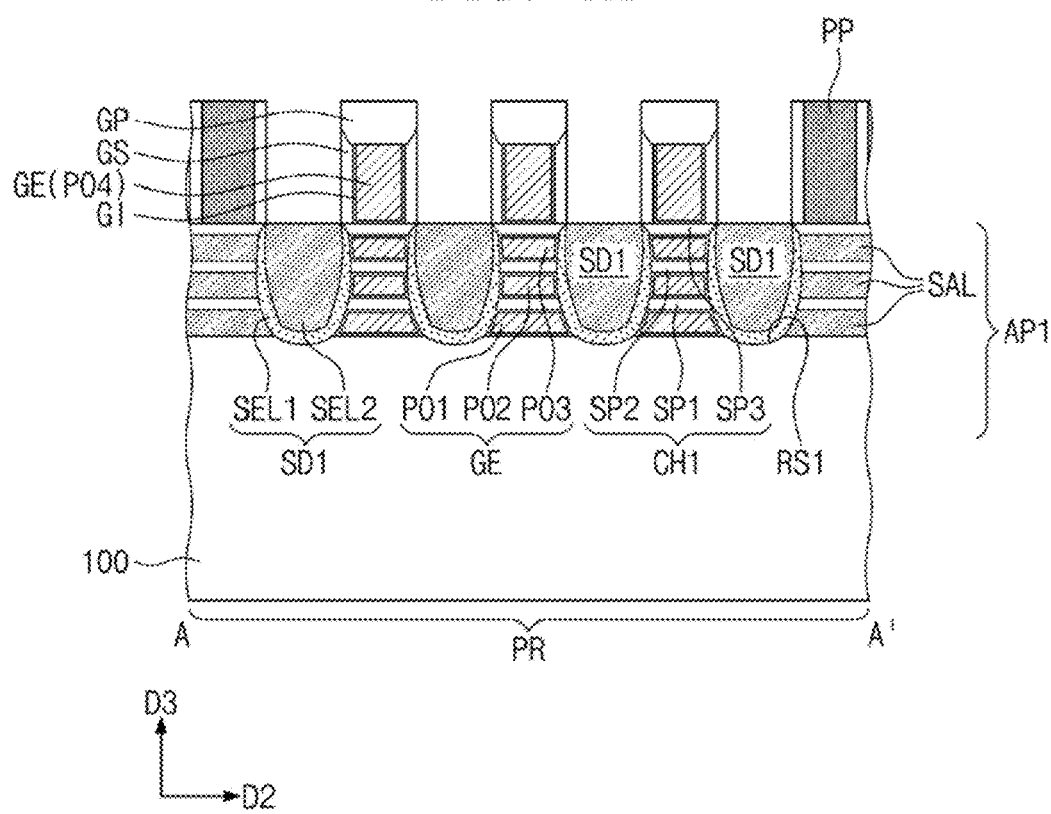
Figure 8B:
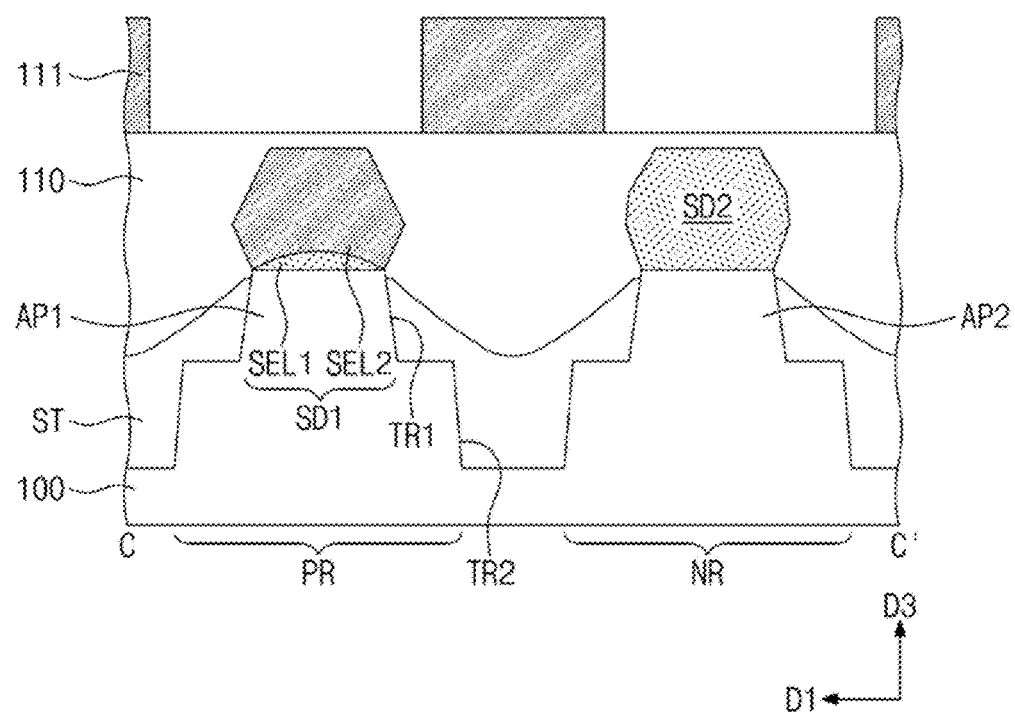
Figure 8C:
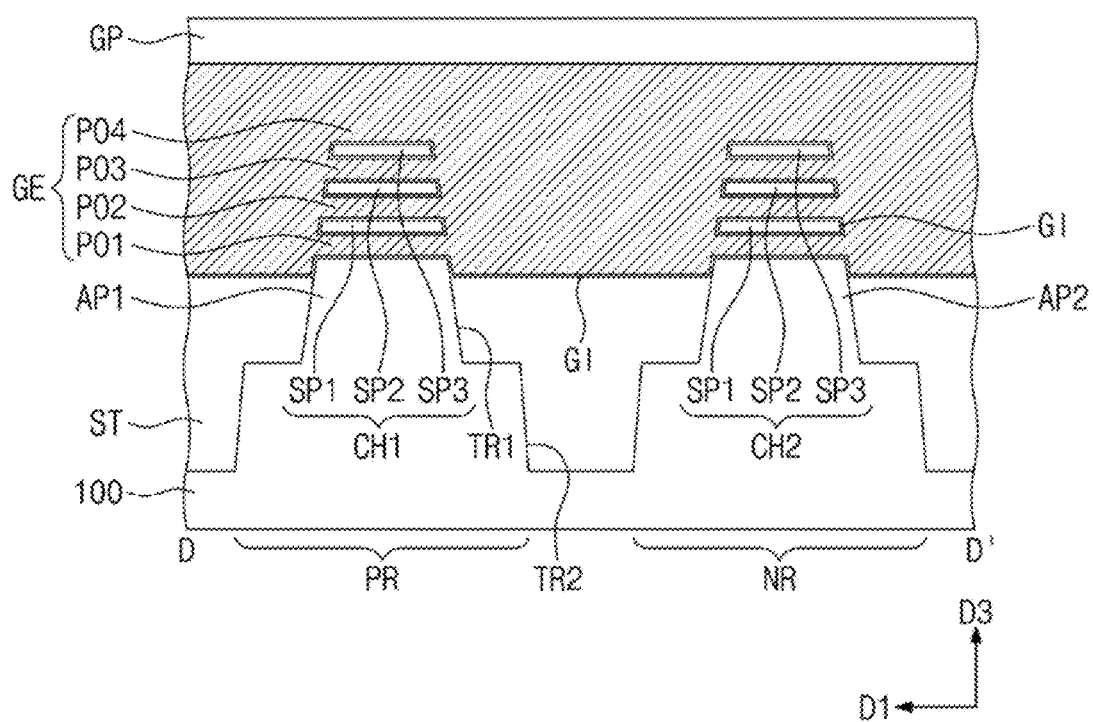

Referring to FIGS. 8A to 8C, an upper portion of the first interlayer insulating layer 110 between the gate electrodes GE may be removed, and the fence patterns 111, which are used to define regions for the active contacts AC, may be formed between the gate electrodes GE. The fence patterns 111 may be formed of or include at least one of $SiO_2$, SiN, SiC, SiOC, or $AlO_x$.

Figure 9A:
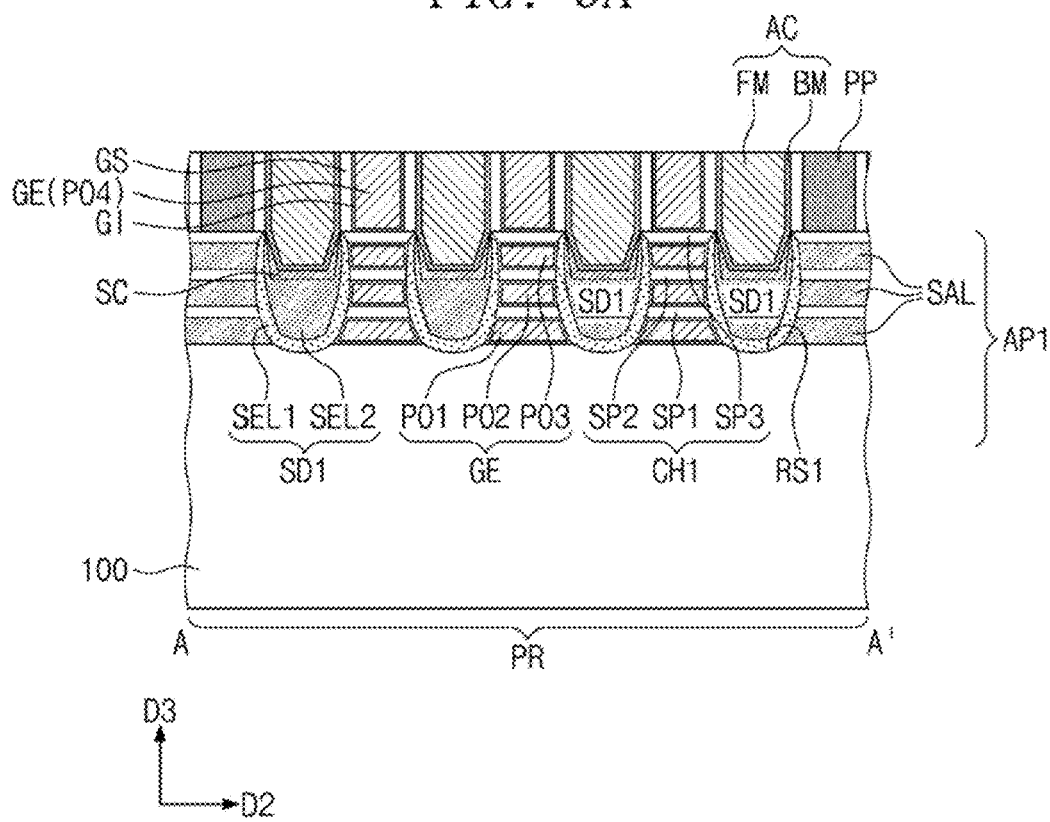
Figure 9B:
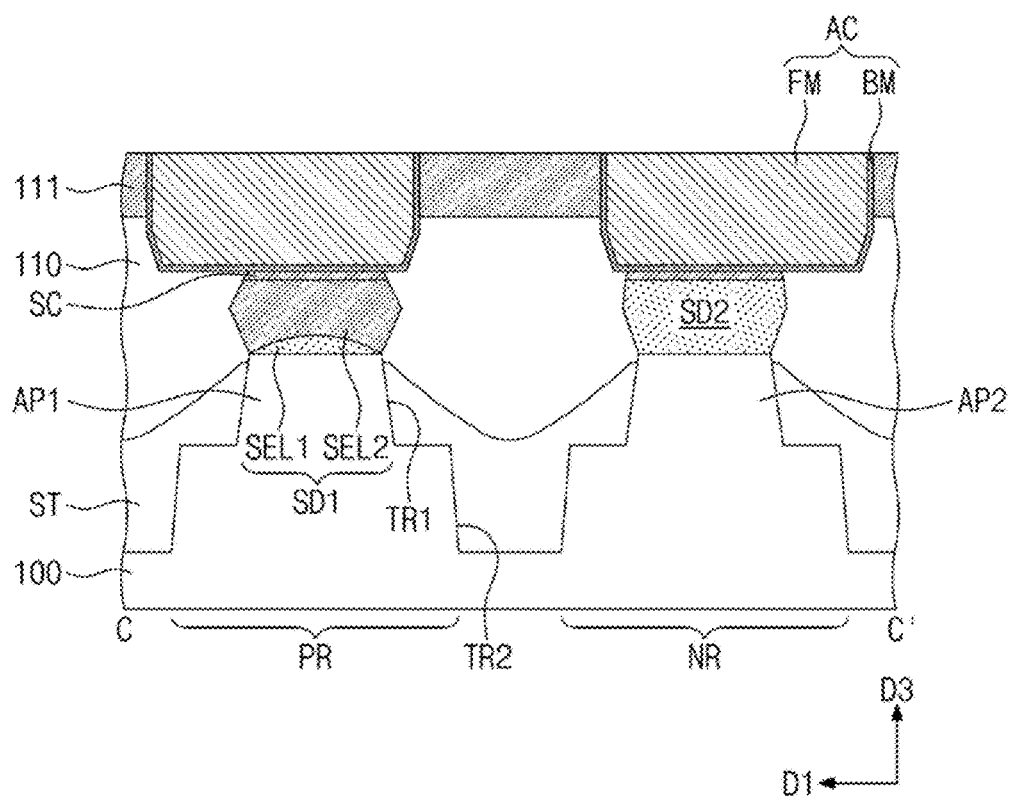
Figure 9C:
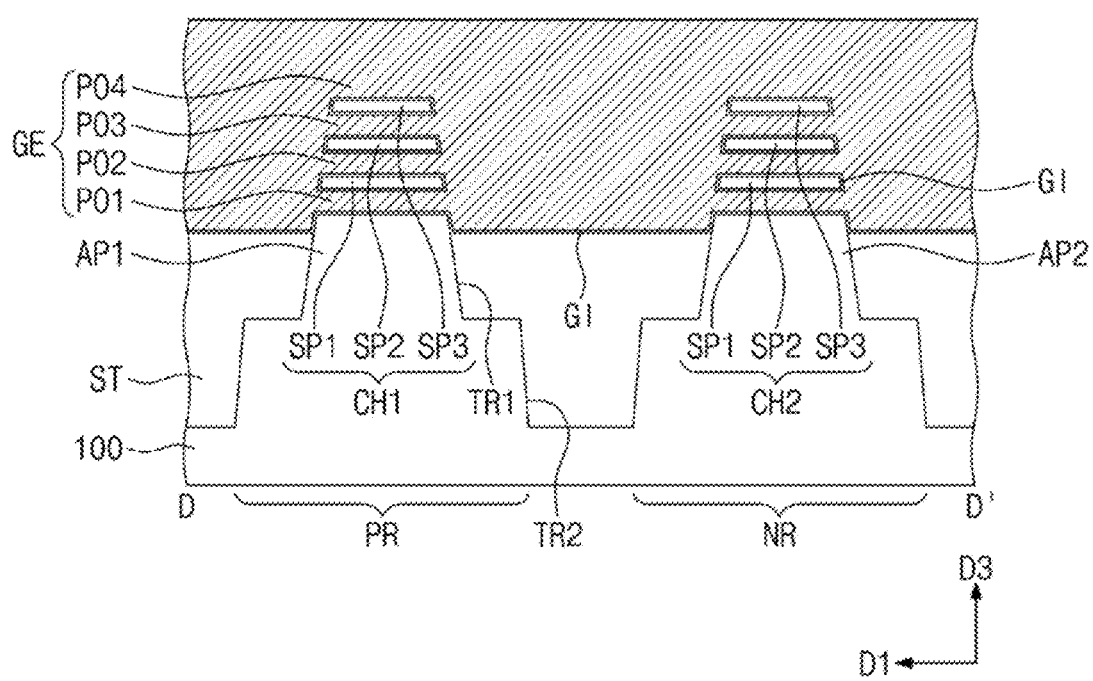
Figure 10A:
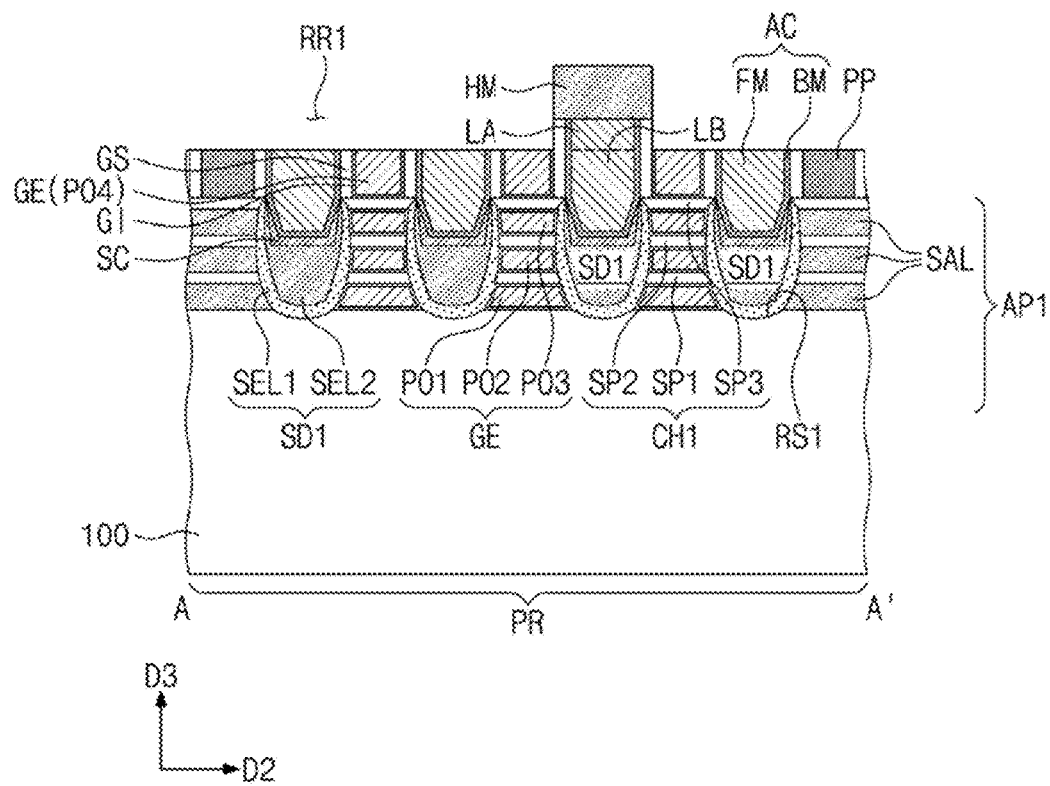
Figure 10B:
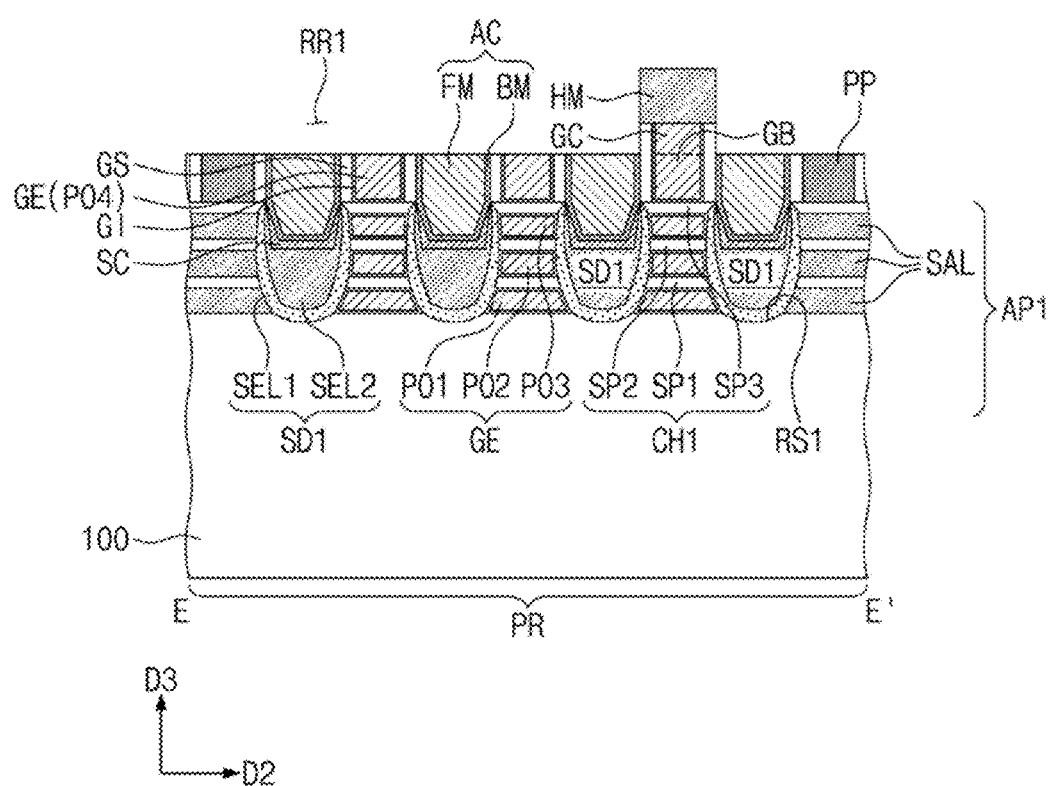
Figure 10C:
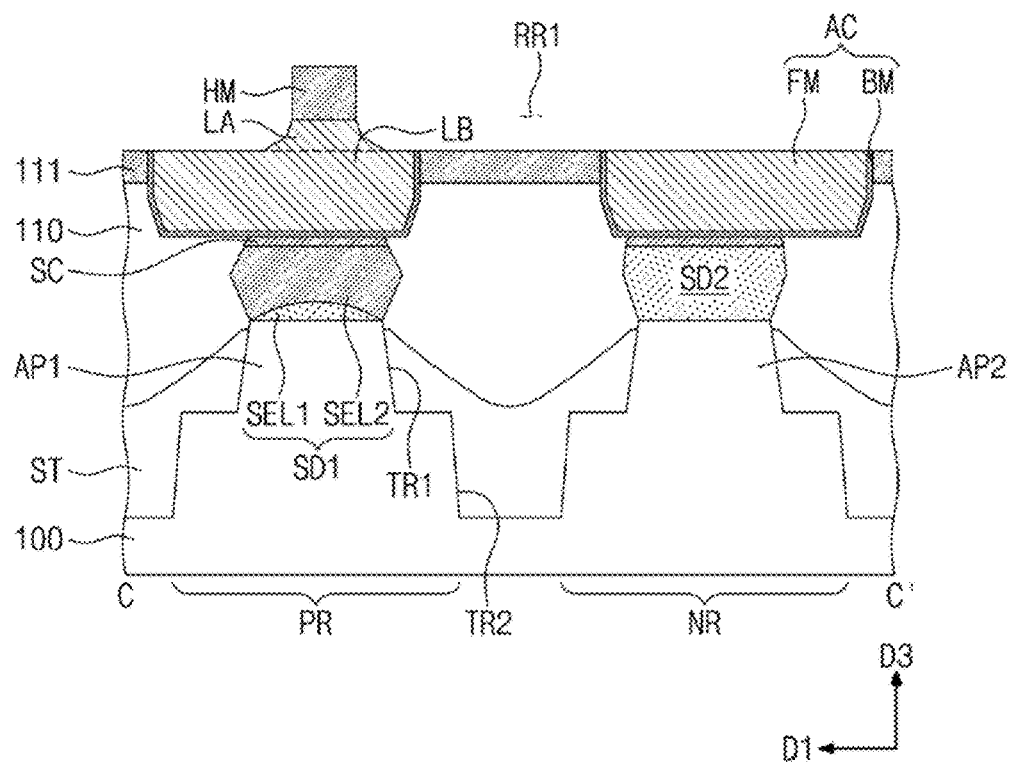
Figure 10D:
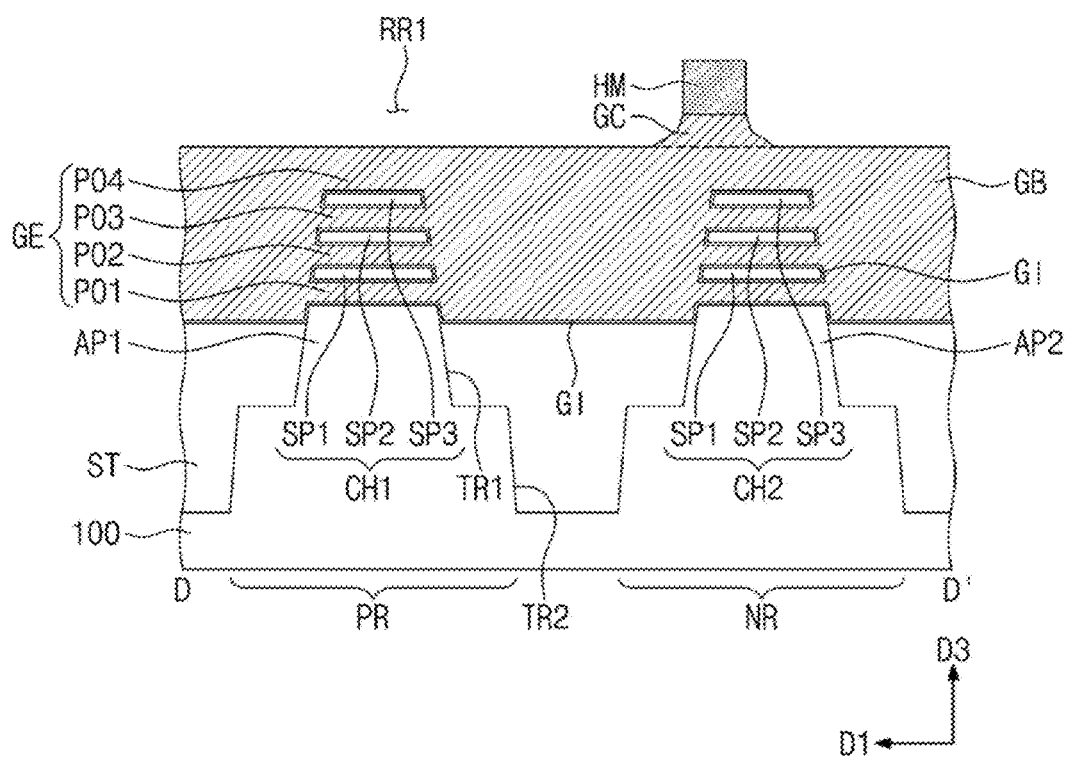
Figure 11A:
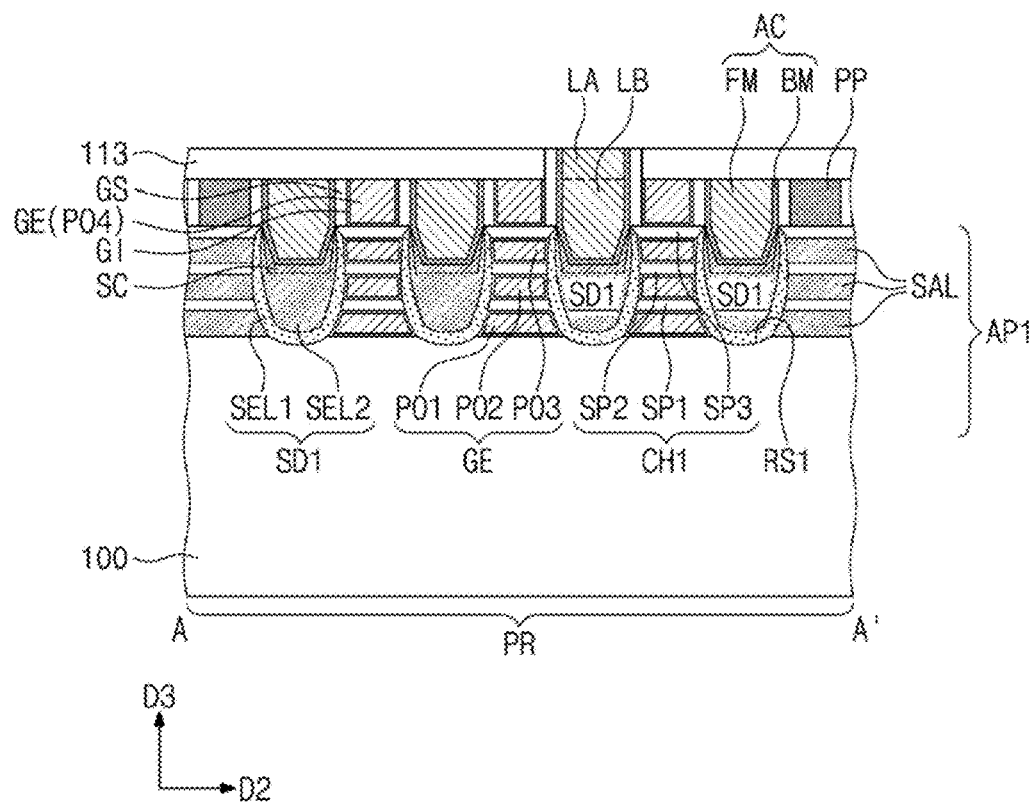
Figure 11B:
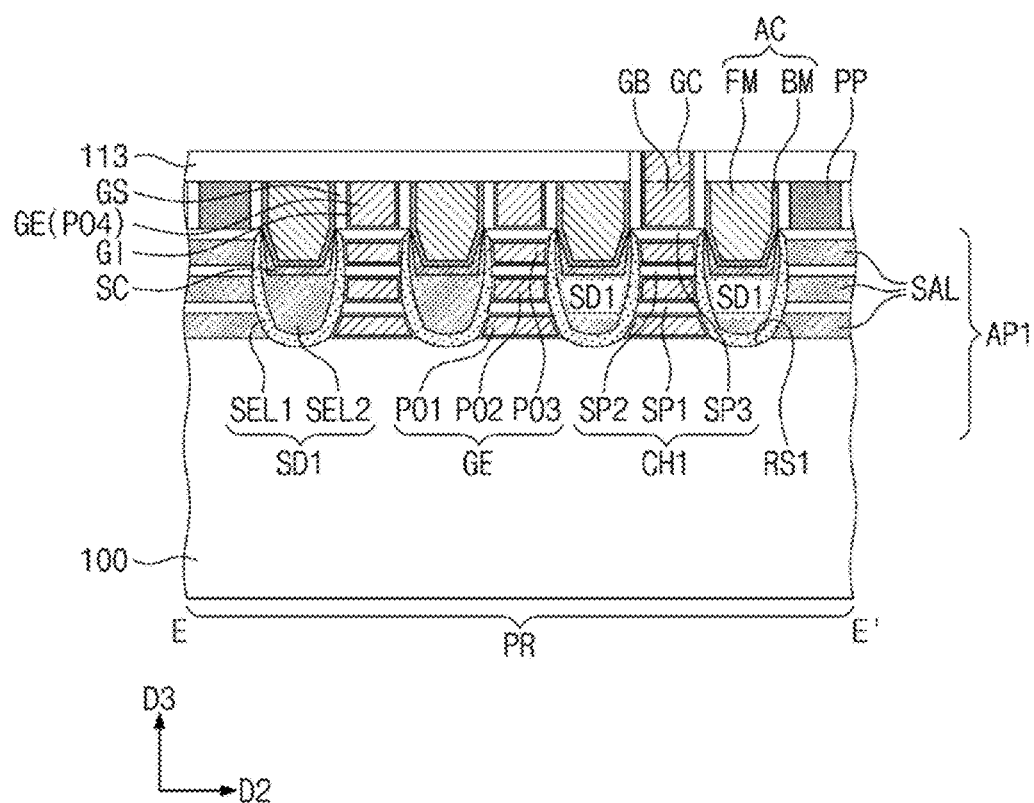
Figure 11C:
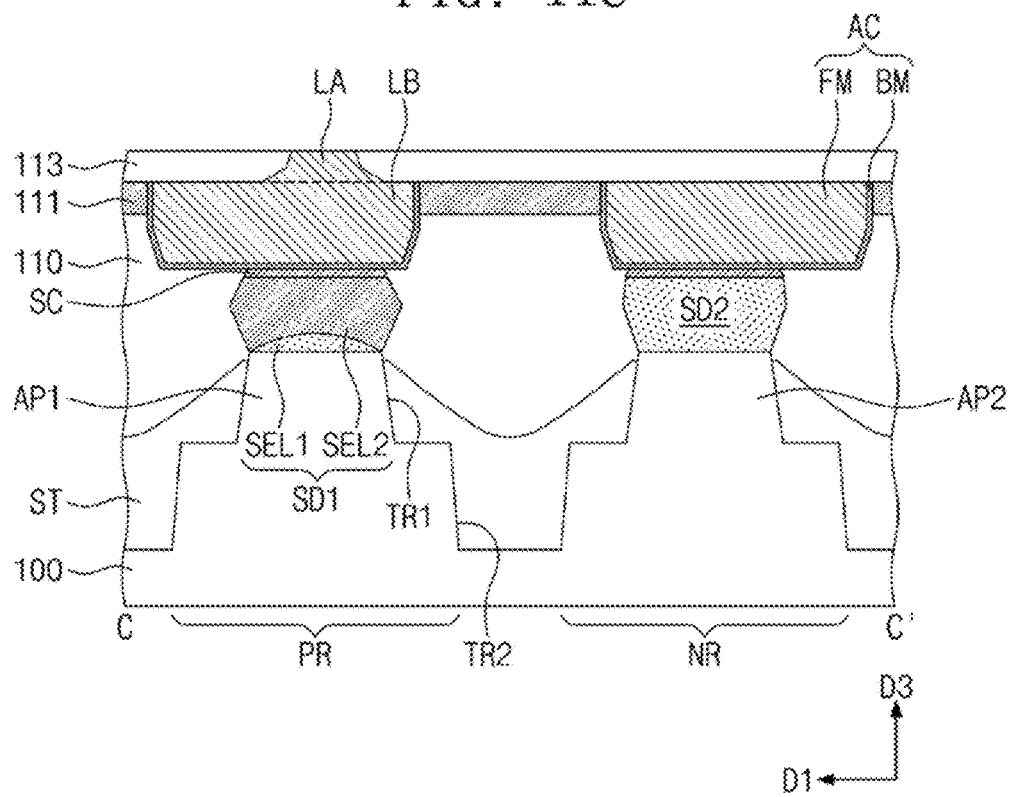
Figure 11D:
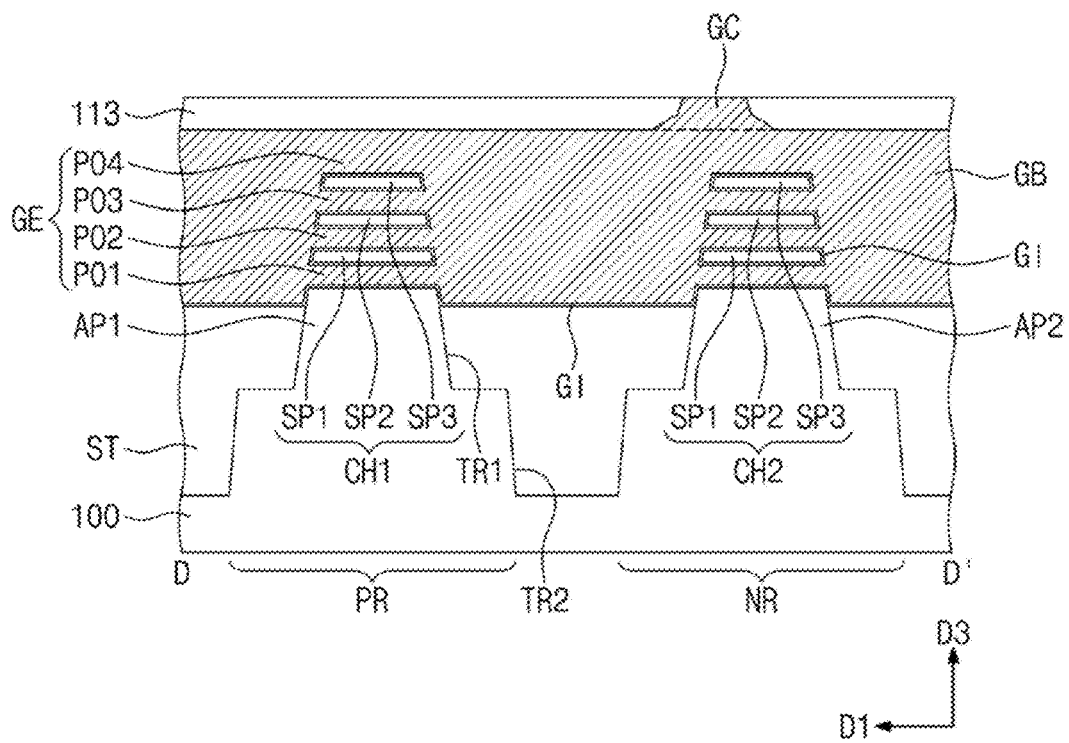
Figure 12A:
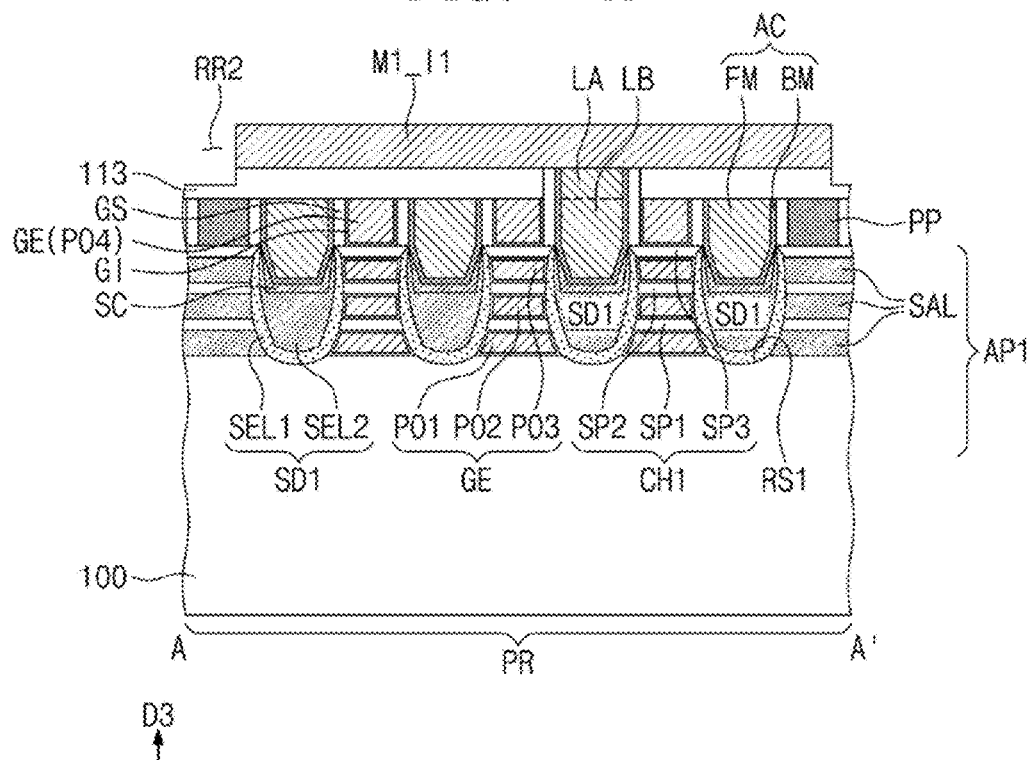
Figure 12B:
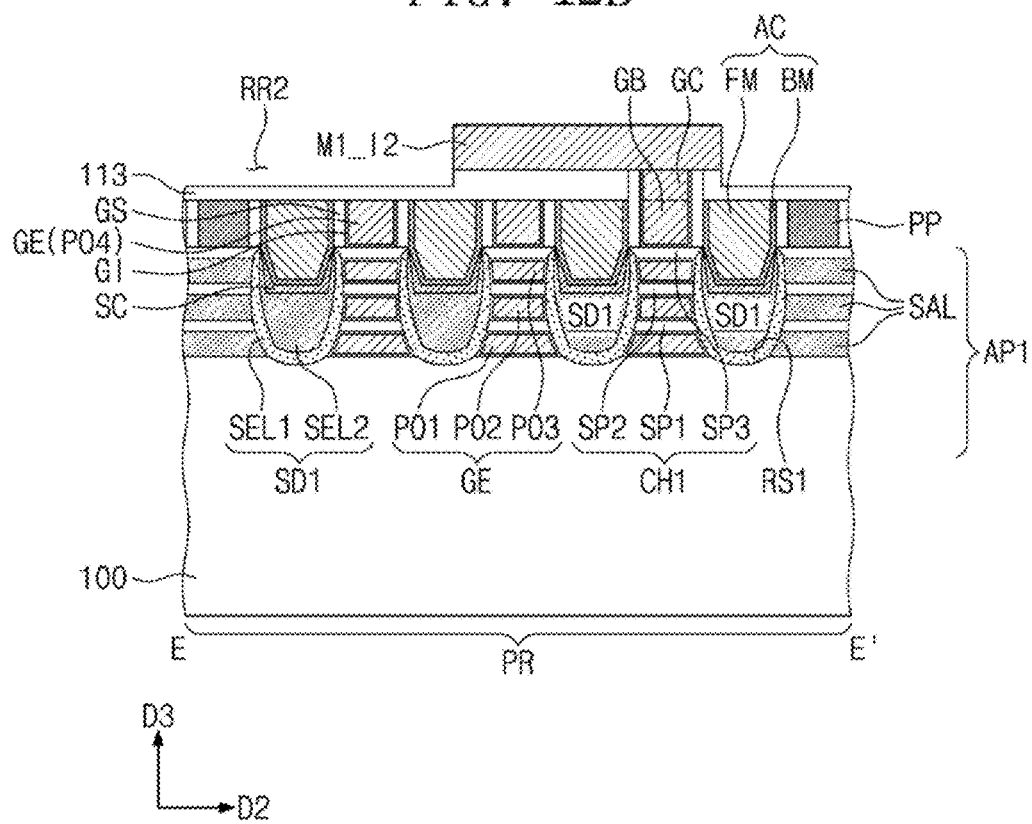
Figure 12C:
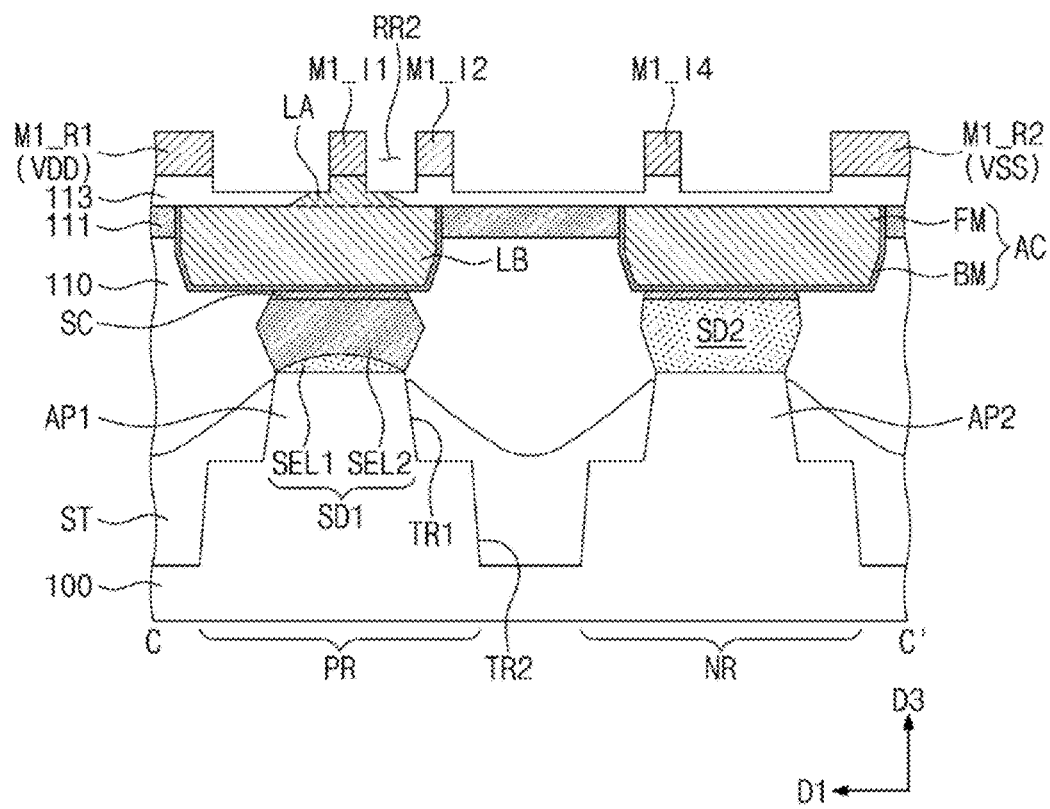
Figure 12D:
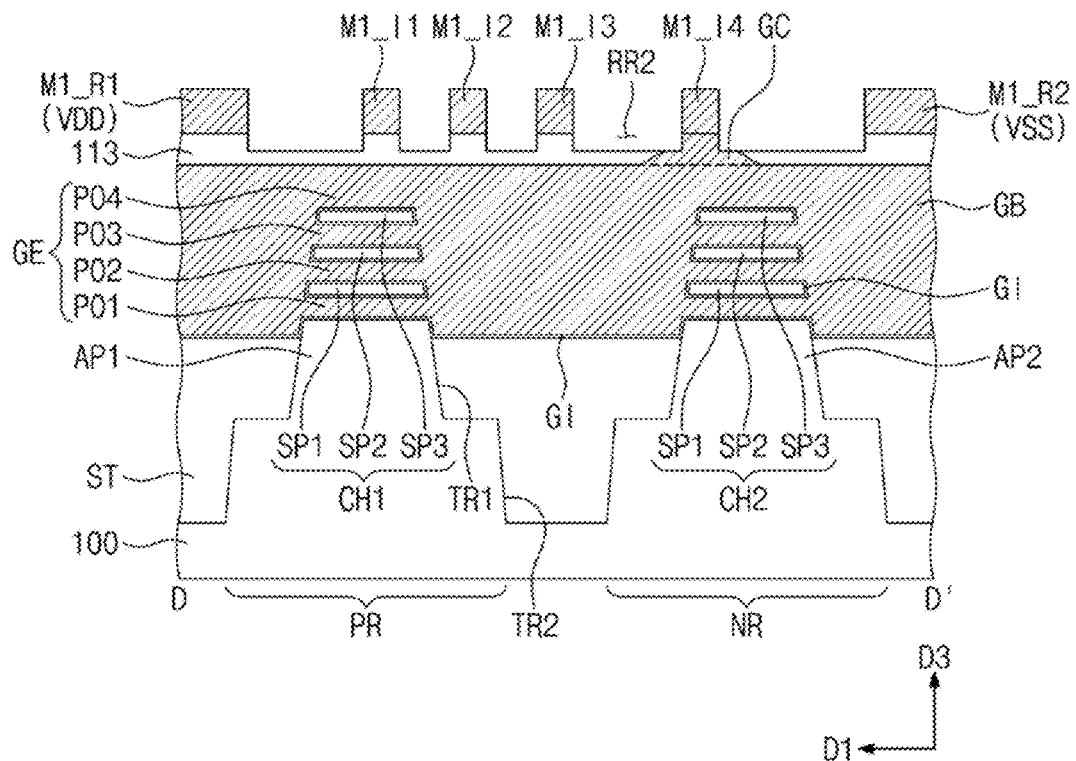

Referring to FIGS. 9A to 9C, the first interlayer insulating layer 110 between the fence patterns 111 may be removed to expose the first source/drain pattern SD1 and the second source/drain pattern SD2, and then, the active contact AC may be formed on the first source/drain pattern SD1 and the second source/drain pattern SD2. The formation of the active contact AC may include sequentially forming the barrier pattern BM and the conductive pattern FM and performing a planarization process. The planarization process may be performed to expose the top surfaces of the gate electrodes GE. The barrier pattern BM may be formed to include a metal layer and a metal nitride layer. The conductive pattern FM may be formed of or include at least one of metallic materials (e.g., aluminum, copper, tungsten, molybdenum, and cobalt). During the formation of the active contacts AC, the silicide patterns SC may be respectively formed between the active contact AC and the first source/drain pattern SD1 and between the active contact AC and the second source/drain pattern SD2. In some example embodiments, the silicide pattern SC may be formed of or include at least one of titanium silicide, tantalum silicide, tungsten silicide, nickel silicide, or cobalt silicide.

Referring to FIGS. 10A to 10D, mask patterns HM may be formed to define the gate protruding portions GC in upper portions of the gate electrodes GE and to define the contact protruding portions LA in upper portions of the active contacts AC. The mask patterns HM may be formed of or include at least one of photoresist materials, silicon nitride, or silicon oxynitride. The first recess regions RR1 may be formed by etching the upper portions of the gate electrodes GE and the active contacts AC exposed by the mask patterns HM. As a result, the gate protruding portions GC may be formed in the upper portions of the gate electrodes GE, and the contact protruding portions LA may be formed in the upper portions of the active contacts AC. Lower portions of the gate electrodes GE below the gate protruding portions GC may be defined as the gate body portions GB, and lower portions of the active contacts AC below the contact protruding portions LA may be defined as the contact body portions LB. The formation of the first recess region RR1 may include a dry and/or wet etching process. The gate protruding portions GC and the contact protruding portions LA may be formed as a result of the same etching process, but in some example embodiments, they may be separately formed by different etching processes. In the case where the steps of forming the gate protruding portions GC, forming the contact protruding portions LA, and forming insulating layers covering them process are performed through separate deposition processes, the semiconductor device may be formed to have the structure of FIG. 3E.

Referring to FIGS. 11A to 11D, the mask patterns HM may be removed, an insulating layer may be formed to fill the first recess region RR1, and then, the second interlayer insulating layer 113 may be formed by performing a planarization process on the insulating layer. A top surface of the second interlayer insulating layer 113 may be formed at the same level as top surfaces of the contact protruding portions LA and top surfaces of the gate protruding portions GC. The second interlayer insulating layer 113 may be formed of or include at least one of $SiO_2$, SiN, SiC, SiOC, or $AlO_x$.

Referring to FIGS. 12A to 12D, a metal layer may be formed on the second interlayer insulating layer 113 and may be patterned to form the lower interconnection lines M1_R1, M1_R2, and M1_I1 to M1_I5. During the patterning of the metal layer, the second interlayer insulating layer 113, the contact protruding portions LA, and the gate protruding portions GC may also be partially etched to form the second recess region RR2.

Referring back to FIGS. 2A to 2E, the second metal layer M2 including the upper vias VI and the upper interconnection lines M2_I may be formed. The second metal layer M2 may be formed in the fourth interlayer insulating layer 140. The upper interconnection line M2_I and the upper via VI of the second metal layer M2 may be formed at once by a dual damascene process. The lower interconnection lines M1_R1, M1_R2, and M1_I1 to M1_I5 and the upper interconnection lines M2_I may be formed of or include at least one of metallic materials (e.g., aluminum, copper, tungsten, molybdenum, and cobalt).

According to some example embodiments of the inventive concepts, a semiconductor device may include a contact protruding portion, which constitutes an upper portion of an active contact, and a gate protruding portion, which constitutes an upper portion of a gate electrode, and thus, the active contact and the gate electrode may be easily connected to lower interconnection lines without an additional via or contact interposed therebetween. Accordingly, it may be possible to prevent a misalignment issue or a connection failure, which may occur when the additional via or contact is formed. In addition, due to recess regions, it may be possible to separate the contact protruding portion from the gate protruding portion by a sufficient large distance and thereby to prevent a process defect (e.g., a contact or short issue between the contact protruding portion and the gate protruding portion).

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
    an active pattern on a substrate;
    a source/drain pattern on the active pattern;
    a channel pattern connected to the source/drain pattern;
    a gate electrode on the channel pattern;
    an active contact on the source/drain pattern;
    a first lower interconnection line on the gate electrode; and
    a second lower interconnection line, which is on the active contact and is at a same level as the first lower interconnection line,
    wherein the gate electrode includes an electrode body portion and an electrode protruding portion, wherein the electrode protruding portion protrudes from a top surface of the electrode body portion and is in contact with a bottom surface of the first lower interconnection line, and
    wherein the active contact includes a contact body portion and a contact protruding portion, wherein the contact protruding portion protrudes from a top surface of the contact body portion and is in contact with a bottom surface of the second lower interconnection line.

2. The semiconductor device of claim 1, wherein a top surface of the electrode protruding portion is located at a same level as a top surface of the contact protruding portion.

3. The semiconductor device of claim 1, wherein the electrode body portion and the electrode protruding portion form a single object without an interface therebetween.

4. The semiconductor device of claim 3, further comprising:
    a gate insulating layer between the gate electrode and the channel pattern,
    wherein the gate insulating layer is extended from a region on a side surface of the electrode body portion to a region on a side surface of the electrode protruding portion.

5. The semiconductor device of claim 1, wherein the electrode protruding portion comprises a stepwise structure, at which a slope of a side surface of the electrode protruding portion is discontinuously changed.

6. The semiconductor device of claim 1, wherein the electrode protruding portion comprises a side surface aligned to a side surface of the first lower interconnection line.

7. The semiconductor device of claim 1, further comprising:
    an interlayer insulating layer covering the top surface of the electrode body portion and a side surface of the electrode protruding portion,
    wherein the interlayer insulating layer covers the top surface of the contact body portion and a side surface of the contact protruding portion.

8. The semiconductor device of claim 1, further comprising:
    a first interlayer insulating layer covering the top surface of the electrode body portion and a side surface of the electrode protruding portion;
    a second interlayer insulating layer covering the top surface of the contact body portion and a side surface of the contact protruding portion; and
    a liner insulating layer between the first interlayer insulating layer and the second interlayer insulating layer.

9. The semiconductor device of claim 1, wherein the contact body portion and the contact protruding portion are form a single object without an interface therebetween.

10. The semiconductor device of claim 1, wherein the active contact comprises a barrier pattern, wherein the barrier pattern is extended from a region on a side surface of the contact body portion to a region on a side surface of the contact protruding portion.

11. The semiconductor device of claim 1, wherein the contact protruding portion comprises a stepwise structure, at which a slope of a side surface of the contact protruding portion is discontinuously changed.

12. The semiconductor device of claim 1, wherein the first lower interconnection line and the second lower interconnection line are extended in a direction crossing an extension direction of the gate electrode and are parallel to each other.

13. A semiconductor device, comprising:
    an active pattern on a substrate;
    a source/drain pattern on the active pattern;
    a channel pattern connected to the source/drain pattern;
    a gate electrode on the channel pattern;
    an active contact on the source/drain pattern;
    a first lower interconnection line on the gate electrode; and
    a second lower interconnection line, which is on the active contact and is at a same level as the first lower interconnection line,
    wherein the gate electrode includes an electrode body portion and an electrode protruding portion, wherein the electrode protruding portion protrudes from a top surface of the electrode body portion and is in contact with a bottom surface of the first lower interconnection line, and
    the electrode protruding portion comprises a first stepwise structure, at which a slope of a side surface of the electrode protruding portion is discontinuously changed.

14. The semiconductor device of claim 13, further comprising:
    a gate insulating layer between the gate electrode and the channel pattern,
    wherein the gate insulating layer is extended from a region on a side surface of the electrode body portion to a region on a separate side surface of the electrode protruding portion.

15. The semiconductor device of claim 13, wherein
    the active contact comprises a contact body portion and a contact protruding portion, wherein the contact protruding portion protrudes from a top surface of the contact body portion and is in contact with a bottom surface of the second lower interconnection line, and
    a top surface of the electrode protruding portion and a top surface of the contact protruding portion are located at a same level.

16. The semiconductor device of claim 15, wherein the contact protruding portion comprises a second stepwise structure, at which a slope of a side surface of the contact protruding portion is discontinuously changed.

17. The semiconductor device of claim 13, wherein the side surface of the electrode protruding portion is at least partially aligned to a side surface of the first lower interconnection line.

18. A semiconductor device, comprising:
    a substrate including a PMOSFET region and an NMOSFET region, which are adjacent to each other in a first direction;

a first active pattern and a second active pattern on the PMOSFET and NMOSFET regions, respectively;

a first source/drain pattern and a second source/drain pattern on the first active pattern and the second active pattern, respectively;

active contacts on the first and second source/drain patterns, respectively;

a first channel pattern and a second channel pattern, which are respectively connected to the first source/drain pattern and the second source/drain pattern, each channel pattern of the first and second channel patterns including a first semiconductor pattern, a second semiconductor pattern, and a third semiconductor pattern which are sequentially stacked and isolated from direct contact with each other;

a first gate electrode and a second gate electrode, which are each extended in the first direction to cross the first and second active patterns, each gate electrode of the first and second gate electrodes including
- a first portion interposed between the substrate and the first semiconductor pattern,
- a second portion interposed between the first semiconductor pattern and the second semiconductor pattern,
- a third portion interposed between the second semiconductor pattern and the third semiconductor pattern, and
- a fourth portion on the third semiconductor pattern;

a first gate insulating layer and a second gate insulating layer, the first gate insulating layer interposed between the first channel pattern and the first gate electrode, the second gate insulating layer interposed between the second channel pattern and the second gate electrode;

a first gate spacer and a second gate spacer on side surfaces of the first and second gate electrodes, respectively;

a first metal layer on the first and second gate electrodes, the first metal layer comprising first interconnection lines; and a second metal layer provided on the first metal layer, the second metal layer comprising second interconnection lines electrically connected to the first interconnection lines, respectively, wherein each of the active contacts includes a contact body portion and a contact protruding portion that protrudes from atop surface of the contact body portion and is in contact with a bottom surface of a corresponding one of the first interconnection lines, and each of the first and second gate electrodes includes an electrode body portion and an electrode protruding portion that protrudes from a top surface of the electrode body portion and is in contact with a bottom surface of a separate first interconnection line of the first interconnection lines.

19. The semiconductor device of claim 18, wherein a top surface of the electrode protruding portion and a top surface of the contact protruding portion are located at a same level.

20. The semiconductor device of claim 19, further comprising:

a gate insulating layer between the gate electrode and the channel pattern, wherein the gate insulating layer is extended from a region on a side surface of the electrode body portion to a region on a side surface of the electrode protruding portion.

* * * * *